United States Patent
Yamaguchi et al.

(10) Patent No.: US 6,509,211 B2
(45) Date of Patent: Jan. 21, 2003

(54) SEMICONDUCTOR DEVICE HAVING SOI STRUCTURE AND METHOD OF FABRICATING THE SAME

(75) Inventors: Yasuo Yamaguchi, Hyogo (JP); Shigenobu Maeda, Hyogo (JP); Iijong Kim, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/790,699

(22) Filed: Feb. 23, 2001

(65) Prior Publication Data

US 2001/0019871 A1 Sep. 6, 2001

Related U.S. Application Data

(62) Division of application No. 09/161,275, filed on Sep. 28, 1998, now Pat. No. 6,225,663, which is a continuation of application No. PCT/JP96/01648, filed on Jun. 14, 1996.

(51) Int. Cl.[7] .............................................. H01L 21/339
(52) U.S. Cl. ..................... 438/148; 438/149; 438/153; 438/423
(58) Field of Search ............................... 438/148, 151, 438/152, 153, 154, 423, 479, 517, 528, 149, 157, 155, 164, 165, 775, 769

(56) References Cited

U.S. PATENT DOCUMENTS

| | | |
|---|---|---|
| 5,060,035 A | 10/1991 | Nishimura et al. |
| 5,125,007 A | 6/1992 | Yamaguchi et al. |
| 5,341,028 A | 8/1994 | Yamaguchi et al. |
| 5,343,051 A | 8/1994 | Yamaguchi et al. |
| 5,355,012 A | 10/1994 | Yamaguchi et al. |
| 5,424,225 A | 6/1995 | Yamaguchi et al. |
| 5,508,209 A | 4/1996 | Zhang et al. |
| 5,514,902 A | 5/1996 | Kawasaki et al. |
| 5,605,847 A | 2/1997 | Zhang |

FOREIGN PATENT DOCUMENTS

| | | |
|---|---|---|
| DE | 44 30 366 | 3/1995 |
| FR | 2 649 831 | 1/1991 |
| JP | 59-132677 | 7/1984 |
| JP | 1-239867 | 9/1989 |
| JP | 2-144969 | 6/1990 |
| JP | 3-66165 | 3/1991 |
| JP | 5-21460 | 1/1993 |
| JP | 6-314698 | 11/1994 |
| JP | 7-176743 | 7/1995 |
| JP | 7-193248 | 7/1995 |
| JP | 8-78674 | 3/1996 |

OTHER PUBLICATIONS

Japanese Notice of Ground of Rejection dated Aug. 31, 2000, with English translation.

*Primary Examiner*—Olik Chaudhuri
*Assistant Examiner*—Theresa T. Doan
(74) *Attorney, Agent, or Firm*—McDermott, Will & Emery

(57) ABSTRACT

A semiconductor device having an SOI structure capable of effectively preventing diffusion of an impurity from a source/drain region on an endmost portion of a silicon layer under a gate electrode is disclosed. In this semiconductor device, nitrogen is introduced into at least either a source/drain region or an end portion of a semiconductor layer located under a gate electrode, and the concentration profile of the nitrogen has a first concentration peak at least in either one of an endmost portion of the source/drain region in the direction where the gate electrode extends and an endmost portion of the semiconductor layer located under the gate electrode. Due to this concentration profile of nitrogen, point defects or the like serving as mediation for diffusion of an impurity are trapped, whereby diffusion of the impurity from the source/drain region is inhibited as a result. Thus, generation of an abnormal leakage current or the like is prevented.

4 Claims, 20 Drawing Sheets

SEMICONDUCTOR DEVICE HAVING SOI STRUCTURE AND METHOD OF FABRICATING THE SAME

REFERENCE TO RELATED APPLICATIONS

This application is a division of application Ser. No. 09/161,275, filed Sep. 28, 1998, now U.S. Pat. No. 6,225, 663 continuation of International Application No. PCT/JP96/01648, whose international filing date is Jun. 14, 1996, the disclosure of which application is incorporated by reference herein. The benefit of the filing and priority dates of the International Application is respectfully requested.

BACKGROUND OF THE INVENTION

1. Field of the Invention

The present invention relates to a semiconductor device, and more specifically, it relates to a semiconductor device having an SOI structure and a method of fabricating the same.

2. Description of the Background Art

FIG. 29 is a plan view showing the structure of a conventional SOI transistor, FIG. 30 is a sectional view along the line 100—100 in FIG. 29, and FIG. 31 is a sectional view along the line 200—200 in FIG. 29. Referring to FIG. 29 to FIG. 31, a buried oxide film 2 is formed on a silicon substrate 1 in the conventional SOI transistor. A silicon layer 3 is formed on the buried oxide film 2. A gate electrode 12 is provided on the silicon layer 3 through a thin gate insulator film 11. A channel region 15 containing a p-type impurity of about $1 \times 10^{17}/cm^3$ is formed in a region of the silicon layer 3 under the gate electrode 12. Source/drain regions 14 containing an n-type impurity of about $1 \times 10^{20}/cm^3$ are formed at a prescribed interval, to hold the channel region 15. Isolation regions 107 containing a p-type impurity of about $1 \times 10^{18}/cm^3$ which is a higher impurity concentration than the channel region 15 are provided for preventing generation of parasitic MOS transistors on the end portions of the silicon layer 3. In more concrete terms, the end portions of the silicon layer 3 are cut off in ordinary mesa shapes or LOCOS (LOCal Oxidation of Silicon)-isolated. The threshold voltages of these end portions lower since electric fields concentrate or the impurity concentration lowers in such end regions, and the so-called parasitic MOS transistors are generated as a result. In general, therefore, the impurity of a higher impurity concentration than the channel forming region 15 is introduced into the end portions of the silicon layer 3 for increasing the threshold voltages of these portions.

An interlayer isolation film 16 is formed to cover the gate electrode 12, and contact holes 17 are formed in the interlayer isolation film 16 on prescribed regions. Aluminum wires 18 are formed to be connected with the gate electrode 12 and the pair of source/drain regions 14 respectively through the contact holes 17.

With reference to FIG. 32 to FIG. 43, a method of fabricating the conventional SOI transistor is now described. First, holding the buried oxide film 2 having a thickness of about 4000 Å on the silicon substrate 1, the silicon layer 3 consisting of a single crystal having a thickness of about 1000 Å is formed thereon, as shown in FIG. 32. The buried oxide film 2 is formed by that high-temperature heat treatment of about 1300° C. is performed after oxygen ions are injected into the silicon substrate 1 at 200 keV by about $2 \times 10^{18}/cm^2$.

Then, a pad oxide film 4 having a thickness of about 300 Å is formed on the silicon layer 3, and a silicon nitride film 5 having a thickness of about 2000 Å is formed thereon, as shown in FIG. 33. A photoresist 6 shown in FIG. 34 is formed in a prescribed region on the silicon nitride film 5 with a photolithographic technique. This photoresist 6 has a field active layer pattern. The photoresist 6 is employed as a mask for etching the silicon nitride film 5 and the pad oxide film 4, whereby a silicon nitride film 5 and a pad oxide film 4 of shapes shown in FIG. 35 are formed. Thereafter boron (B) which is a p-type impurity is injected at 20 keV by about $1 \times 10^{13}/cm^2$, whereby the isolation regions 107 shown in FIG. 36 are formed. Thereafter the photoresist 6 is removed.

Then, a silicon nitride film (not shown) is further deposited on the silicon nitride film 5, and thereafter anisotropic etching is performed thereby forming silicon nitride film spacers 10 shown in FIG. 37 on side walls of the silicon nitride film 5. The silicon nitride film 5 and the silicon nitride film spacers 10 are employed as masks for anisotropically etching the silicon layer 3, whereby an island-shaped silicon layer 3 becoming a field active region shown in FIG. 37 is formed. Thereafter the silicon nitride film 5, the silicon nitride film spacers 10 and the pad oxide film 4 are removed so that a shape shown in FIG. 38 is obtained.

Then, the gate electrode 12 shown in FIG. 39 to FIG. 41 is formed to cover an upper surface and both side surfaces of the silicon layer 3 through the gate insulator film 11. FIG. 39 is a sectional view along a direction where the gate electrode 12 extends, FIG. 40 is a sectional view along a direction orthogonal to FIG. 39, and FIG. 41 is a plan view. A channel dope for adjusting the threshold voltage of the transistor, e.g., boron (B) is injected by about $4 \times 10^{12}/cm^2$ before formation of the gate electrode 12, thereby forming the channel forming region 15. The gate electrode 12 is patterned as shown in FIG. 39 to FIG. 41, and thereafter the gate electrode 12 is employed as a mask for injecting arsenic (As) which is an n-type impurity by about $1 \times 10^{15}/cm^2$, as shown in FIG. 42 and FIG. 43. Thus, the n-type source/drain regions 14 holding the channel region 15 are formed. Due to this ion implantation for forming the source/drain regions 14, the (isolation regions 107 into which the p-type impurity is introduced in portions other than that under the gate electrode 12 disappear as shown in FIG. 43.

After the aforementioned formation of the source/drain regions 14, the interlayer isolation film 16 is deposited while the contact holes 17 are opened as shown in FIG. 29 to FIG. 31, and thereafter the aluminum wires 18 are formed. Thus, the conventional SOI transistor has been completed.

In the SOI structure formed by working the semiconductor layer 3 in the aforementioned island shape, crystallinity on end surface portions of the silicon layer 3 deteriorates. Therefore, accelerative diffusion of the impurity from the source/drain regions 14 takes place in the end portions of the silicon layer 3 located under the gate electrode 12, and accelerative diffusion regions 105 shown in FIG. 44 are formed. There has been such a problem that, when such accelerative diffusion regions. 105 are formed, abnormal leakage characteristics shown in FIG. 45 are caused as transistor characteristics.

SUMMARY OF THE INVENTION

An object of the present invention is to inhibit accelerative diffusion of an impurity from a source/drain region in a semiconductor device having an SOI structure.

Another object of the present invention is to effectively inhibit generation of abnormal leakage characteristics in a semiconductor device having an SOI structure.

A semiconductor device having an SOI structure according to one aspect of the present invention comprises a semiconductor layer, a pair of source/drain regions of a first conductivity type, and a gate electrode. The semiconductor layer is formed on an insulator and has a major surface. The pair of source/drain regions are formed at an interval to define a channel region on the major surface of the semiconductor substrate. The gate electrode is formed on the major surface of the semiconductor layer through a gate insulator film. Nitrogen is introduced into at least either end portions of the source/drain regions in a direction where the gate electrode extends or an end portion of the semiconductor layer located under the gate electrode. The concentration profile of the nitrogen has a first concentration peak in at least either endmost portions of the source/drain regions in the direction where the gate electrode extends or an endmost portion of the semiconductor layer located under the gate electrode. By thus introducing nitrogen to have a concentration peak in either the endmost portions of the source/drain regions in the direction where the gate electrode extends or the endmost portion of the semiconductor layer located under the gate electrode, the impurity from the source/drain regions is inhibited from diffusing in the endmost portion(s). Consequently, it is possible to effectively inhibit the impurity of the source/drain regions from acceleratively diffusing in the end portion of the semiconductor layer located under the gate electrode. In more concrete terms, point defects or the like serving as mediation for diffusion of the impurity of the source/drain regions are trapped by introduced nitrogen atoms, whereby accelerative diffusion of the impurity from the source/drain regions can be inhibited. Thus, generation of abnormal leakage of transistor characteristics can be prevented.

In the structure of the semiconductor device according to the aforementioned one aspect, a high-concentration impurity region of a second conductivity type may be formed on the end portion of the semiconductor layer located under the gate electrode. When thus structuring the semiconductor device, generation of a parasitic transistor on the end portion of the semiconductor layer located under the gate electrode is inhibited.

In the structure of the semiconductor device according to the aforementioned one aspect, the semiconductor device may be so structured as to plurally form the semiconductor layer in the form of islands at intervals on the insulator.

In the semiconductor device according to the aforementioned one aspect, the semiconductor device is so structured as to separate the semiconductor layer into a plurality of semiconductor layers by an element isolation insulator film formed on the major surface of the semiconductor layer, while introducing nitrogen into a region of the semiconductor layer located in the vicinity of a boundary region between the semiconductor layer and the element isolation insulator film and under the gate electrode, and adjusting the concentration profile of nitrogen to have a concentration peak on an endmost portion of the semiconductor layer which is in contact with the element isolation insulator film. Also when practicing in this way, accelerative diffusion of the impurity from the source/drain regions in the SOI structure isolated by the element isolation insulator film can be prevented.

In the structure of the semiconductor device in the aforementioned one aspect, the semiconductor device is so structured as to introduce nitrogen at least into the source/drain regions, while introducing nitrogen also into the channel region in the vicinity of the source/drain regions. When practicing in this way, the impurity of the source/drain regions can be prevented also from diffusing to the channel region side.

In the structure of the semiconductor device in the aforementioned one aspect, the semiconductor device is so structured as to introduce nitrogen into at least the source/drain regions, while locating a second concentration peak of nitrogen in a vertical direction in the vicinity of an interface between the semiconductor layer and the insulator. By structuring the semiconductor device in this way, diffusion of the impurity from the source/drain regions toward the channel region in the vicinity of the interface between the semiconductor layer and the insulator layer where crystallinity of the semiconductor layer conceivably deteriorates can be effectively prevented.

In a method of fabricating a semiconductor device having an SOI structure in another aspect of the present invention, a semiconductor layer having a major surface is formed on an insulator. A first injection mask is formed on the semiconductor layer. The first injection mask is employed as a mask for injecting a first conductivity type impurity into an isolation injection region of the semiconductor layer thereby forming an impurity region having a higher impurity concentration than a channel region. A gate electrode is formed on the major surface of the semiconductor layer through a gate insulator film. The gate electrode is employed as a mask for ion-implanting a second conductivity type impurity into the semiconductor layer thereby forming a source/drain region. At least either one of the first mask and the gate electrode is employed as a mask for injecting nitrogen. Thereafter heat treatment is performed. By injecting nitrogen and performing heat treatment in this way, the injected nitrogen is piled up on an endmost surface of the semiconductor layer where diffusion of the impurity readily takes place and point defects or the like serving as mediation for diffusion of the impurity of the source/drain region are trapped by nitrogen atoms in this portion, whereby diffusion of the impurity of the source/drain region can be inhibited.

In the method according to the aforementioned other aspect, the method is so structured as to perform injection of nitrogen before ion implantation of the second conductivity type impurity for formation of the source/drain region. Thus, diffusion of the second conductivity type impurity in the source/drain region can be further effectively prevented.

In the aforementioned other method, the method may be so structured as to perform ion implantation of nitrogen so that a second concentration peak of nitrogen in the vertical direction is located in the vicinity of an interface between the semiconductor layer and the insulator by employing the gate electrode as a mask. When practicing in this way, diffusion of the impurity in the vicinity of the interface between the semiconductor layer and the insulator where conceivably a crystal deteriorates and diffusion readily takes place can be further effectively prevented.

In the aforementioned other method, the method may be so structured as to inject nitrogen to a side closer to the channel region than ion implantation of the first conductivity type impurity for forming the source/drain region by employing the gate electrode as a mask. When practicing in this way, it comes to that nitrogen is injected into not only the source/drain region but also the channel region in the vicinity of the source/drain region, and diffusion of the impurity of the source/drain region located in the vicinity of the interface between the source/drain region and the channel region into the channel region can be effectively prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
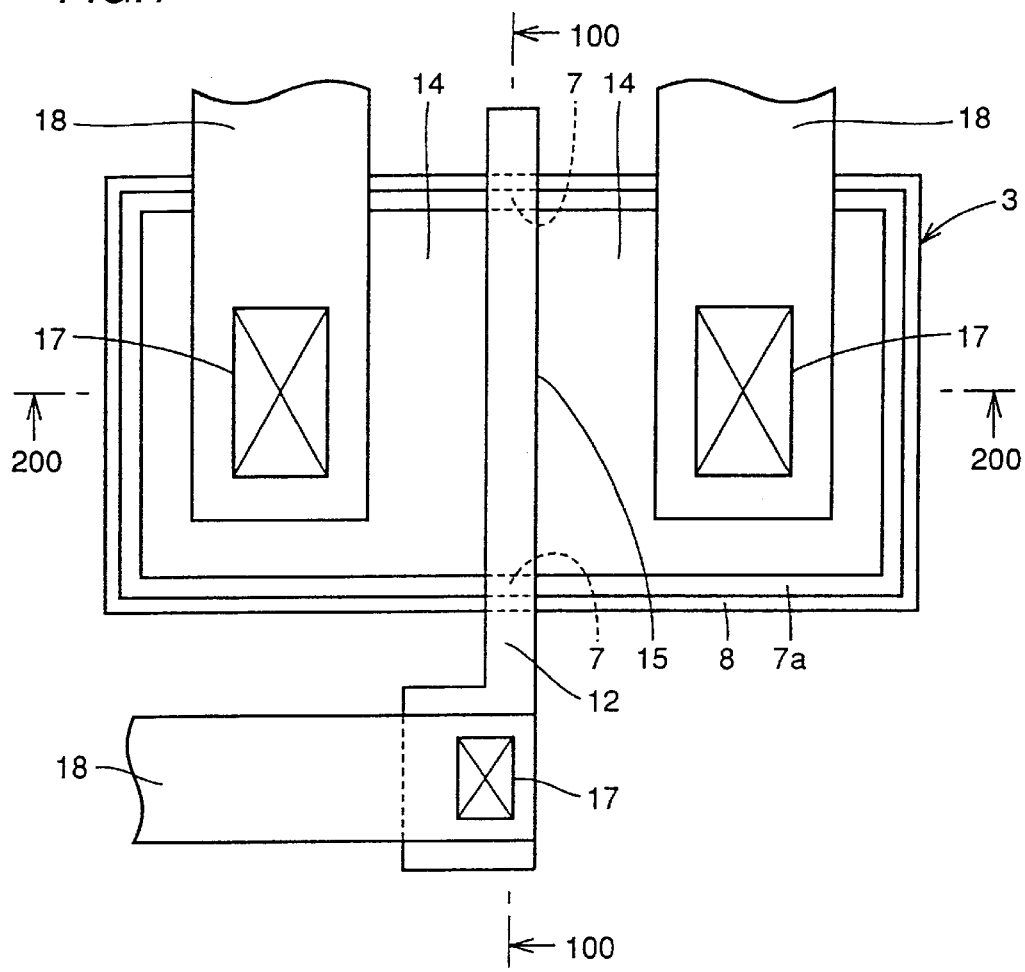
FIG. 1 is a plan view showing a semiconductor device having an SOI structure according to one embodiment of the present invention.

With reference to FIG. 1 to FIG. 4, a semiconductor device having an SOI structure according to a first embodiment of the present invention is now described. In this first embodiment, a buried oxide film 2 is formed on a silicon substrate 1. A silicon layer 3 of a single crystal is formed in a prescribed region on the buried oxide film 2. Source/drain regions 14 containing an n-type impurity of about $1\times10^{20}/cm^3$ are formed on the silicon layer 3 at a prescribed interval, to hold a channel region 15 having a p-type impurity of about $1\times10^{17}/cm^3$. A gate electrode 12 is formed on an upper surface and on side surfaces of the silicon layer 3 through a gate insulator film 11.

Figure 2:
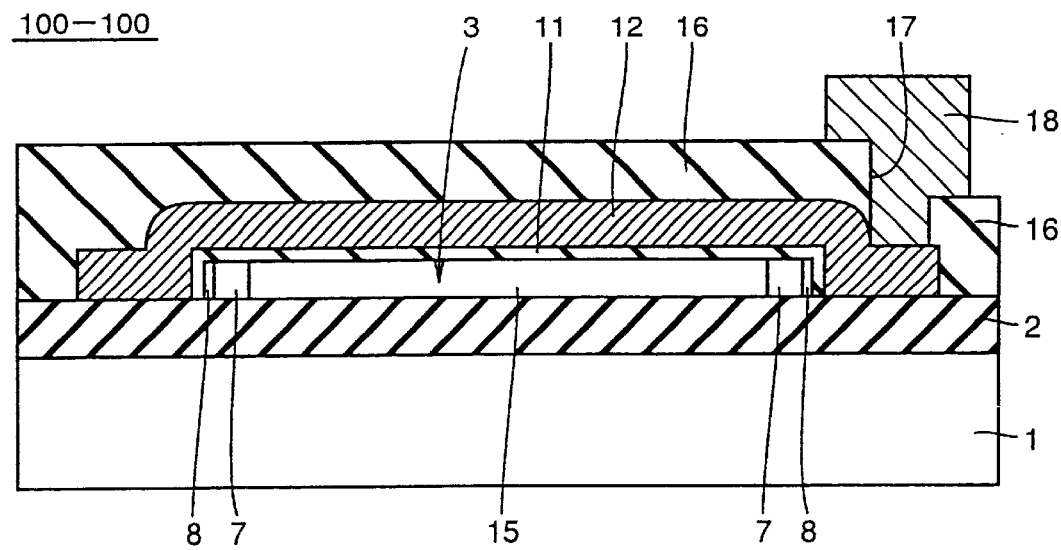
FIG. 2 is a sectional view of the semiconductor device shown in FIG. 1 along the line 100—100.
Figure 4:
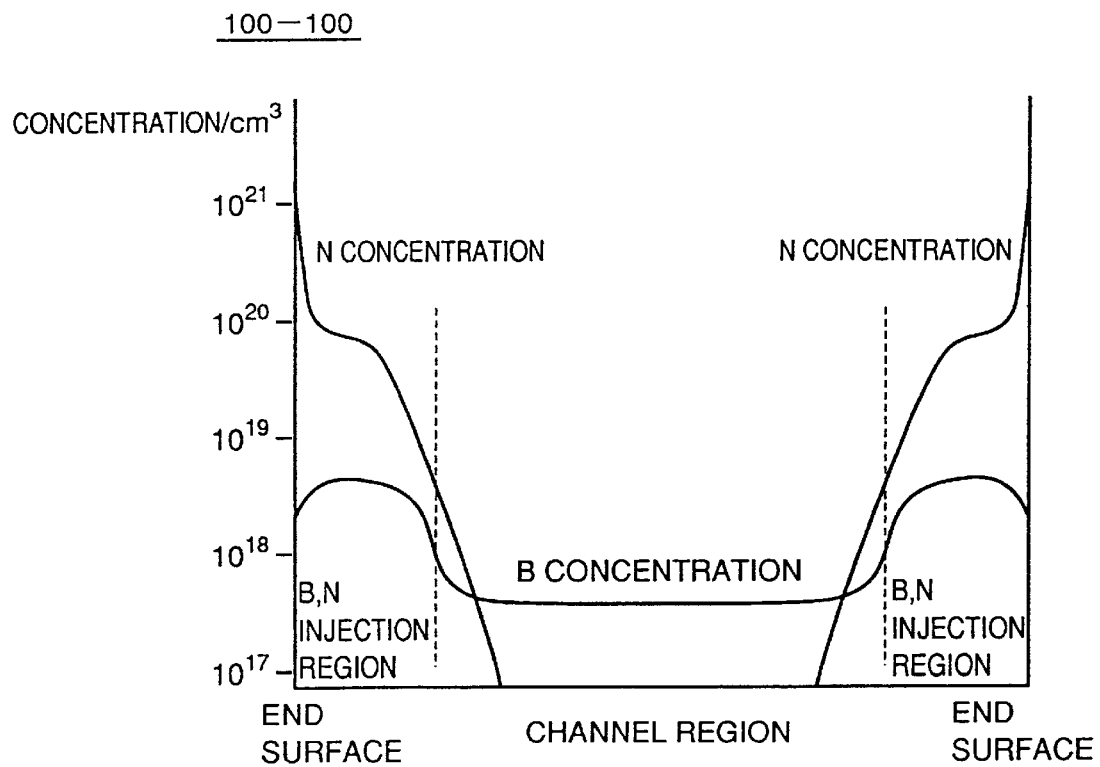
FIG. 4 is an impurity profile diagram of the semiconductor device shown in FIG. 1 along the line 100—100.
Figure 5:
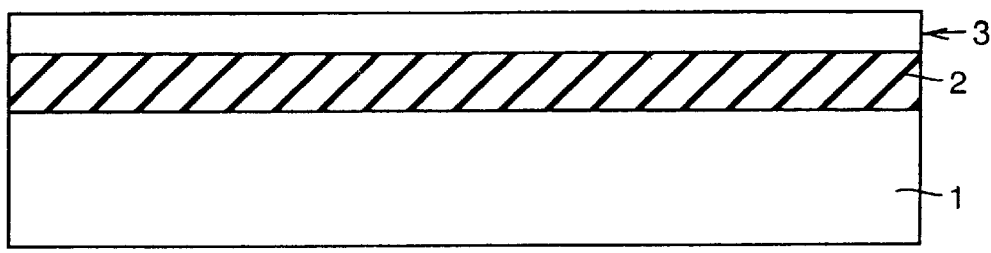
FIG. 5 is a sectional view for illustrating a fabrication process for the semiconductor device shown in FIG. 1 to FIG. 3.
Figure 6:
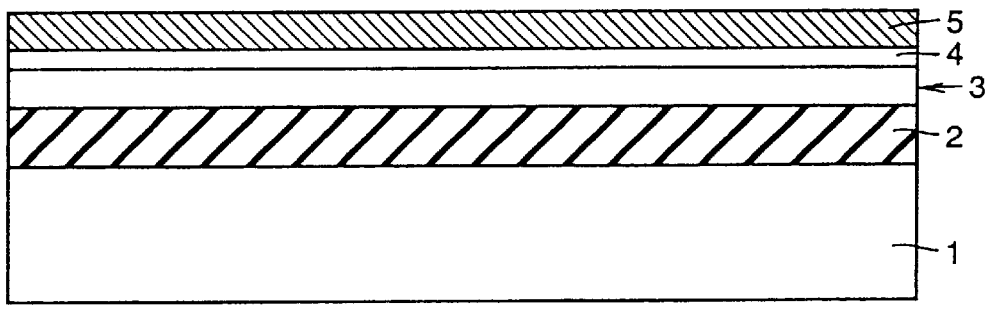
FIG. 6 is a sectional view for illustrating the fabrication process for the semiconductor device shown in FIG. 1 to FIG. 3.
Figure 7:
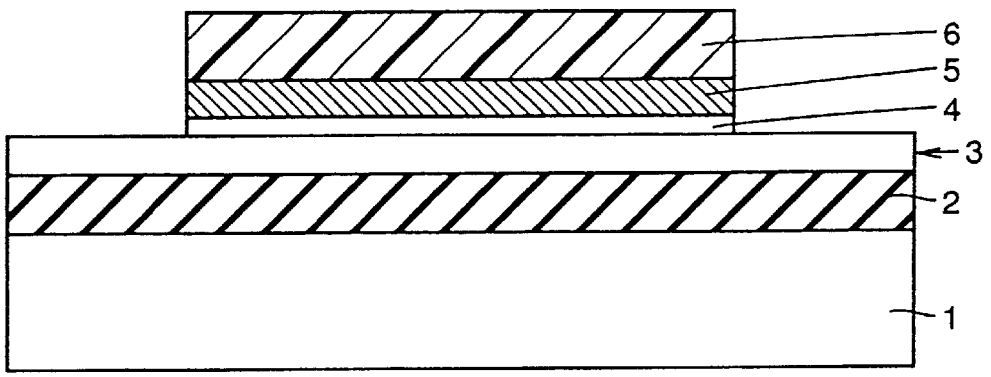
FIG. 7 is a sectional view for illustrating the fabrication process for the semiconductor device shown in FIG. 1 to FIG. 3.
Figure 8:
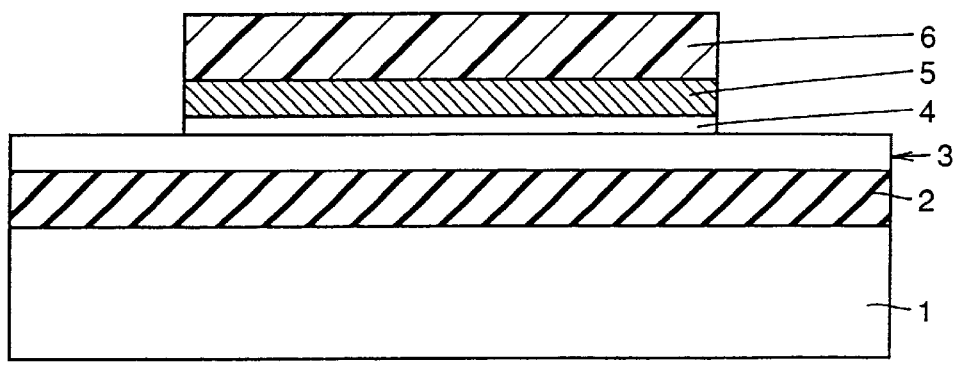
FIG. 8 is a sectional view for illustrating the fabrication process for the semiconductor device shown in FIG. 1 to FIG. 3.

Isolation regions 7 containing a p-type impurity of about $1\times10^{18}/cm^3$ which is a higher impurity concentration than the channel region 15 are provided on end portions of the silicon layer 3 under the gate electrode 12. These isolation regions 7 are provided for preventing generation of parasitic transistors resulting from field concentration on the end portions of the silicon layer 3 under the gate electrode 12. In the semiconductor device according to this embodiment, nitrogen is introduced into the isolation regions 7 in a concentration of about $1\times10^{20}$ /cm$^3$. Nitrogen pileup regions 8 where nitrogen builds up are provided on end surfaces of the silicon layer 3. Referring to FIG. 2 and FIG. 4, it is understood that the concentration of nitrogen is high in the nitrogen pileup regions 8 on the end surfaces of the silicon layer 3, and concentration peaks ($1\times10^{21}/cm^3$) exist on the end surfaces.

Figure 3:
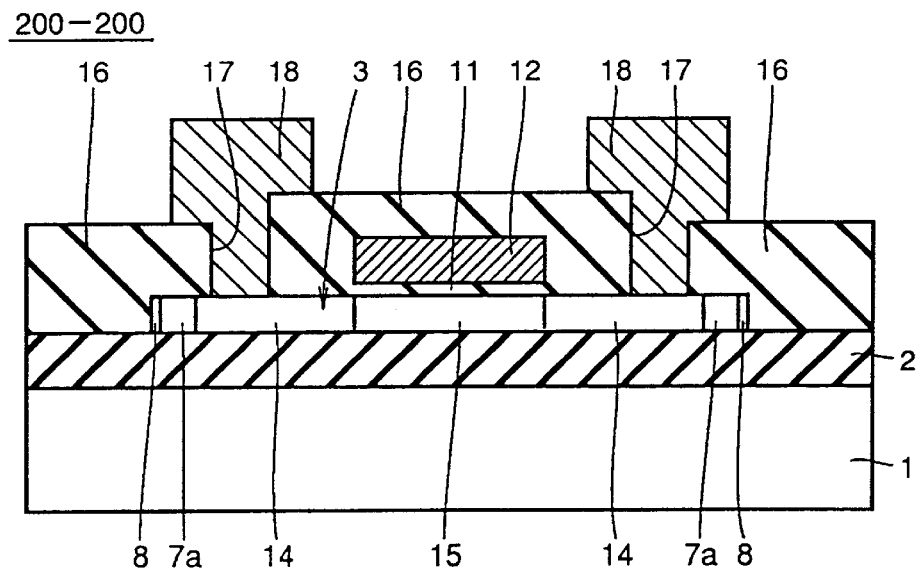
FIG. 3 is a sectional view of the semiconductor device of FIG. 1 along the line 200—200.

An interlayer isolation film 16 is provided to cover the gate electrode 12, and contact holes 17 are provided in regions of the interlayer isolation film 16 located on the source/drain regions 14 and the gate electrode 12 respectively. Aluminum wires 18 are formed to be electrically connected to the source/drain regions 14 and the gate electrode 12 through the contact holes respectively. While isolation regions 7a into which nitrogen is introduced are provided to enclose the source/drain regions 14 as shown in FIG. 3 and FIG. 4, these isolation regions 7a have no P type, dissimilarly to the isolation regions 7.

In this embodiment, as hereinabove described, it is possible to effectively prevent the impurity from the source/drain regions 14 from being acceleratively diffused in endmost surfaces of the silicon layer 3 by introducing nitrogen into the isolation regions 7 and further providing the nitrogen pileup regions 8 having a higher nitrogen concentration in the isolation regions 7 in the vicinity of the endmost surfaces of the silicon layer 3, whereby abnormal leakage currents can be reduced as a result. Further, it becomes possible to also reduce generation of parasitic transistors which have remarkably appeared with diffusion of the impurity from the source/drain regions 14. This is because diffusion of the impurity from the source/drain regions 14 can be inhibited due to the fact that nitrogen atoms trap point defects or the like serving as mediation for diffusion of the impurity of the source/drain regions 14 in the endmost surfaces of the silicon layer 3. Consequently, it is possible to effectively prevent the impurity of the source/drain regions 14 from being acceleratively diffused in the endmost portions of the silicon layer 3 under the gate electrode 12.

Figure 9:
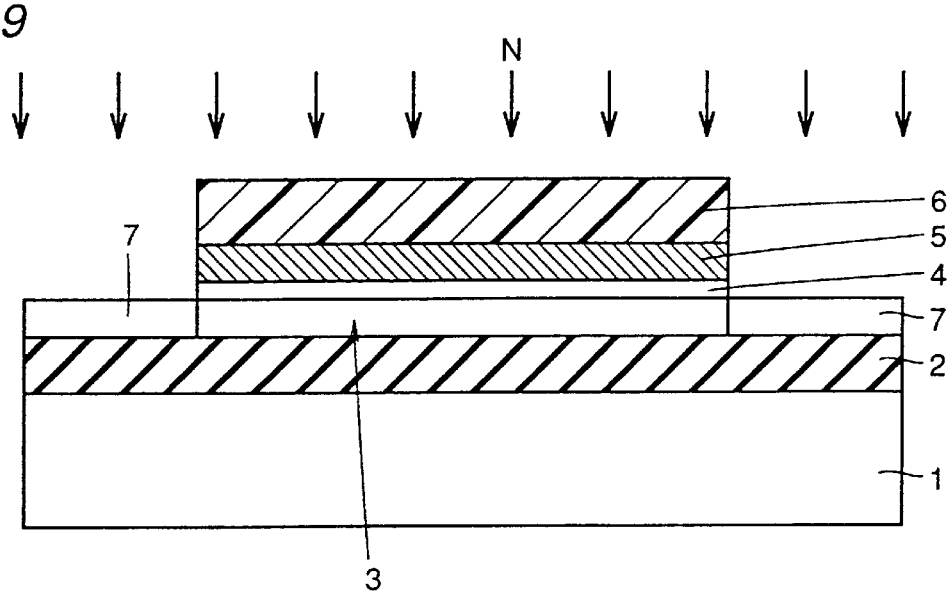
FIG. 9 is a sectional view for illustrating the fabrication process for the semiconductor device shown in FIG. 1 to FIG. 3.
Figure 10:
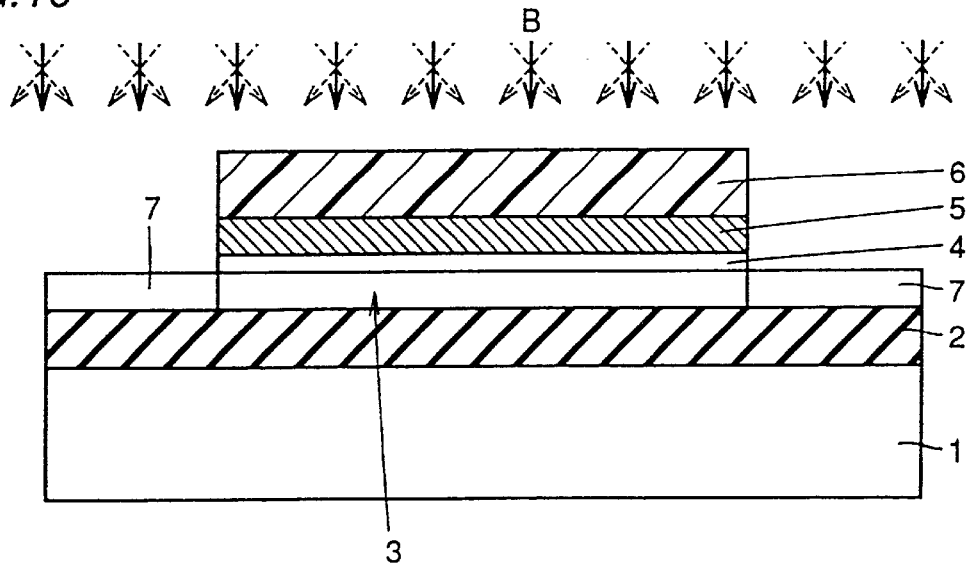
FIG. 10 is a sectional view for illustrating the fabrication process for the semiconductor device shown in FIG. 1 to FIG. 3.
Figure 11:
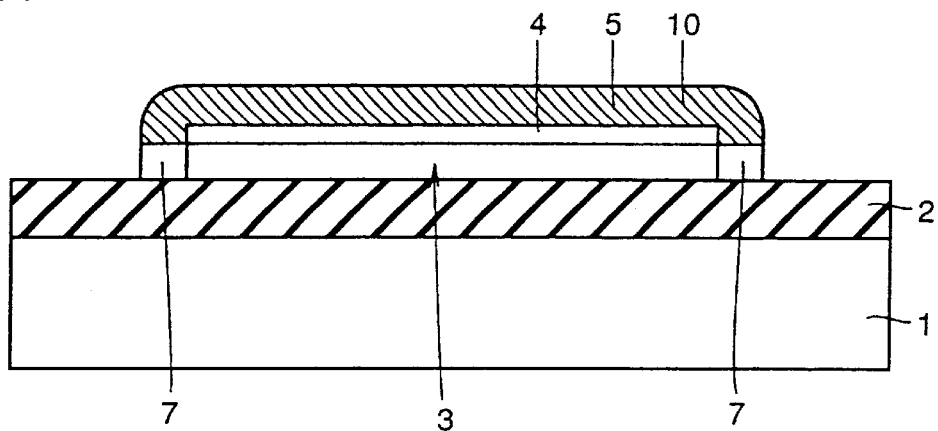
FIG. 11 is a sectional view for illustrating the fabrication process for the semiconductor device shown in FIG. 1 to FIG. 3.
Figure 12:
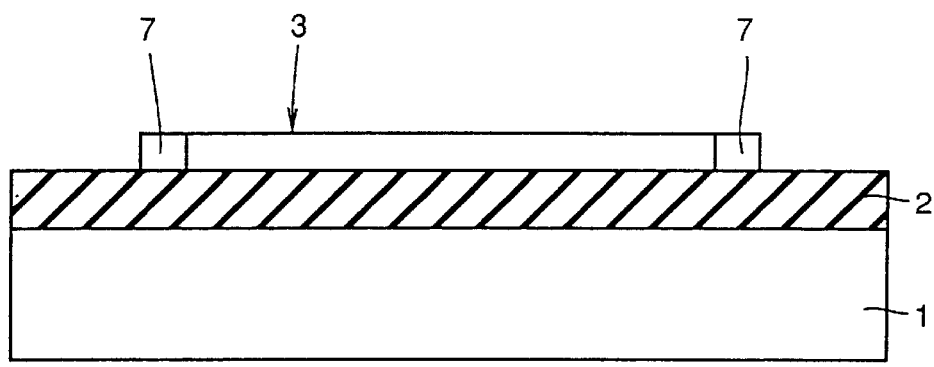
FIG. 12 is a sectional view for illustrating the fabrication process for the semiconductor device shown in FIG. 1 to FIG. 3.
Figure 13:
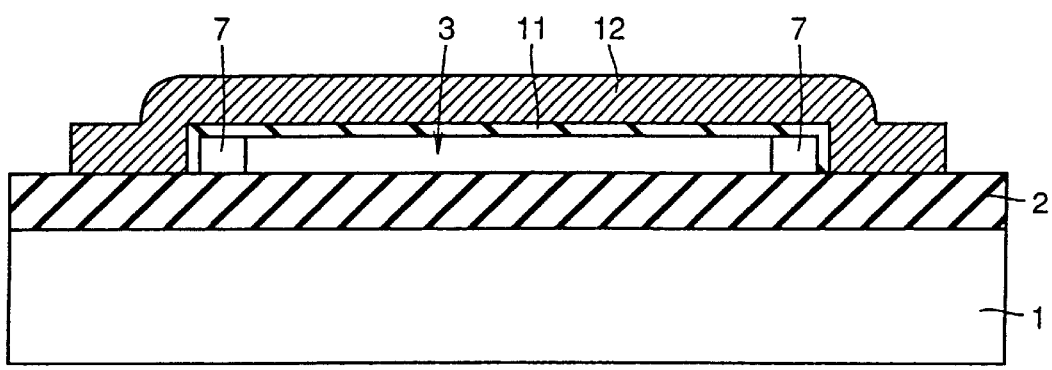
FIG. 13 is a sectional view for illustrating the fabrication process for the semiconductor device shown in FIG. 1 to FIG. 3.
Figure 14:
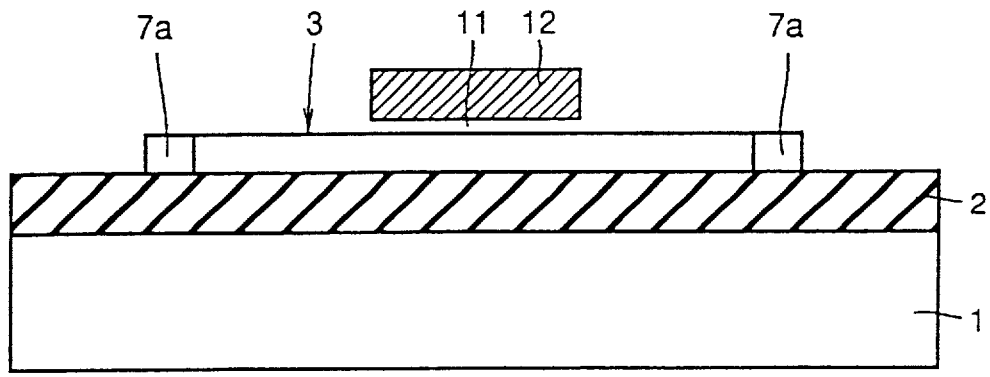
FIG. 14 is a sectional view along a section orthogonal to FIG. 13 in the step shown in FIG. 13.
Figure 15:
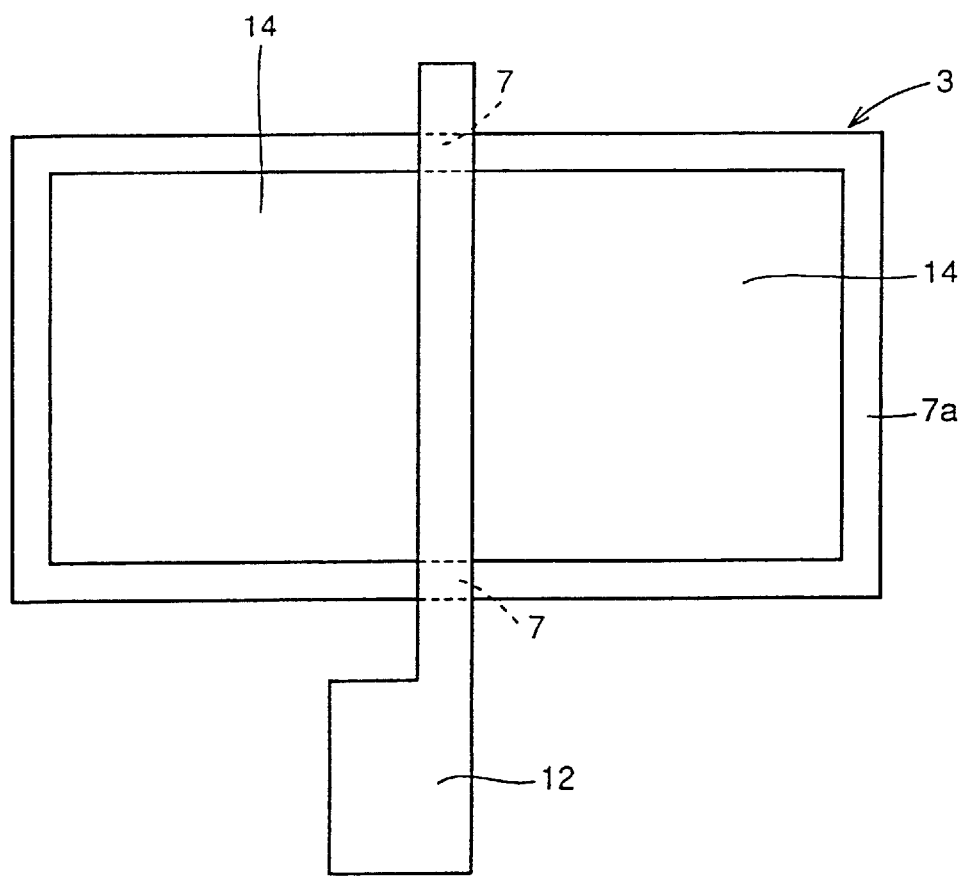
FIG. 15 is a plan view in the steps shown in FIG. 13 and FIG. 14.
Figure 16:
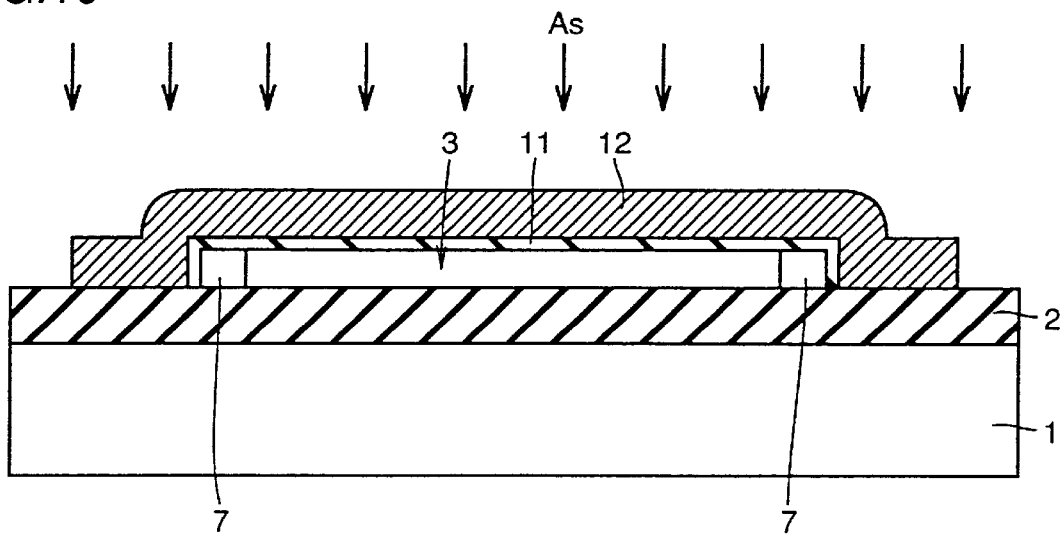
FIG. 16 is a sectional view for illustrating the fabrication process for the semiconductor device of the present invention shown in FIG. 1 to FIG. 3.

With reference to FIG. 5 to FIG. 17, a fabrication process for the semiconductor device according to the first embodiment shown in FIG. 1 to FIG. 4 is now described. First, steps shown in FIG. 5 to FIG. 8 are similar to the steps shown in FIG. 32 to FIG. 35 and hence description is omitted. Then, nitrogen is injected into the silicon layer 3 by employing a photoresist 6 as a mask, as shown in FIG. 9. While injection conditions for nitrogen are performed with injection energy of 10 keV at an injection rate of $1\times10^{15}/cm^2$, for example, there is an effect whatever injection rate is employed so far as the same is within the range of $1\times10^{13}/cm^2$ to $1\times10^{16}/cm^2$. The optimum value of the injection rate is decided by combination with isolation conditions.

Figure 17:
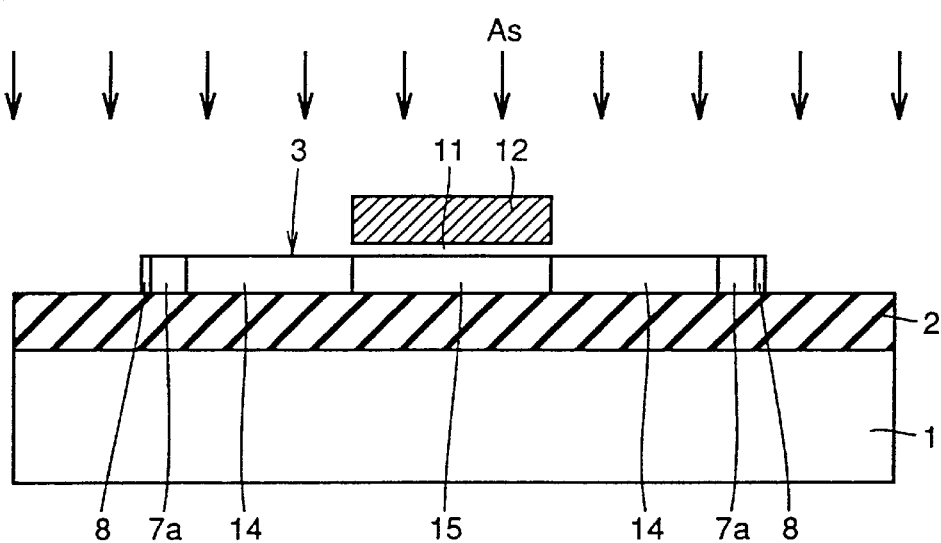
FIG. 17 is a sectional view along a section perpendicular to FIG. 16 in the step shown in FIG. 16.

Injection of nitrogen is adapted to prevent diffusion of the impurity from the source/drain regions 14 on the end surfaces (see FIG. 2) of the silicon layer 3 under the gate electrode 12, and hence it is preferable to introduce nitrogen into regions finally becoming the end surfaces of the silicon layer 3 in a larger quantity. Thereafter the same photoresist 6 is employed as a mask for injecting boron (B) into the isolation regions 7 with injection energy of 20 keV at an injection rate of about $1\times10^{13}/cm^2$. This ion implantation of boron may be a method of perpendicularly injecting the same, or oblique rotational ion implantation may be employed. Thereafter the process of FIG. 11 to FIG. 17 is performed by employing the photoresist 6 and a process similar to the conventional process shown in FIG. 37 to FIG. 43. Ion implantation of arsenic in FIG. 17 is performed with 50 keV at $1\times10^{15}/cm^2$, and thereafter heat treatment of 800° C. and 30 minutes is performed thereby activating arsenic, while the nitrogen pileup regions 8 are formed.

Figure 18:
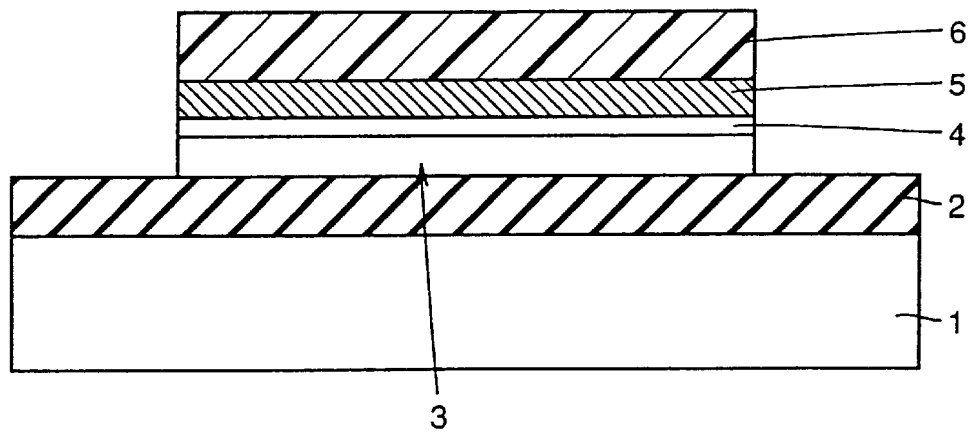
FIG. 18 is a sectional view showing another method for fabricating the semiconductor device of the present invention shown in FIG. 1 to FIG. 3.
Figure 19:
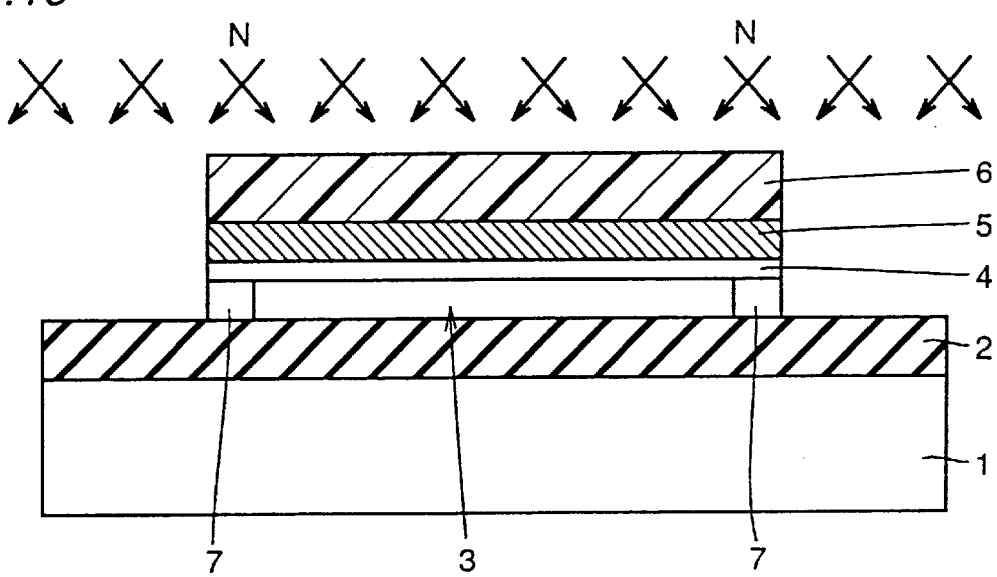
FIG. 19 is a sectional view showing the other method for fabricating the semiconductor device of the present invention shown in FIG. 1 to FIG. 3.
Figure 20:
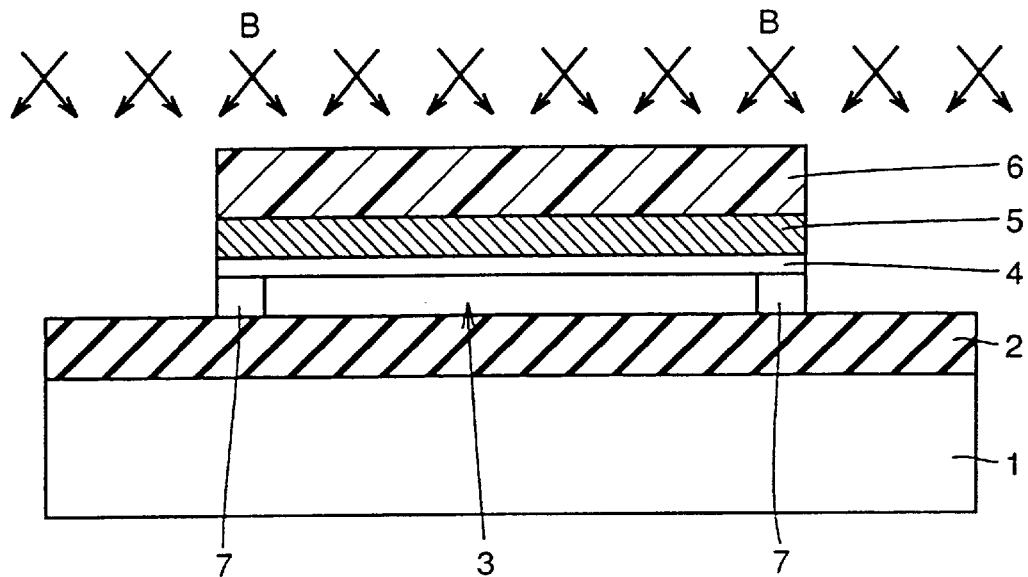
FIG. 20 is a sectional view showing the other method for fabricating the semiconductor device of the present invention shown in FIG. 1 to FIG. 3.

While a silicon nitride film spacer 10 is employed for forming the isolation region 7 under the same in the process of FIG. 8 to FIG. 12, the process may not necessarily depend on this method. For example, the photoresist 6 may be employed as a mask for mesa-working the silicon layer 3 in the form of an island, thereafter injecting nitrogen by employing oblique rotational ion implantation and thereafter injecting boron by further employing an oblique rotational ion implantation method, as shown in FIG. 18 to FIG. 20.

Figure 21:
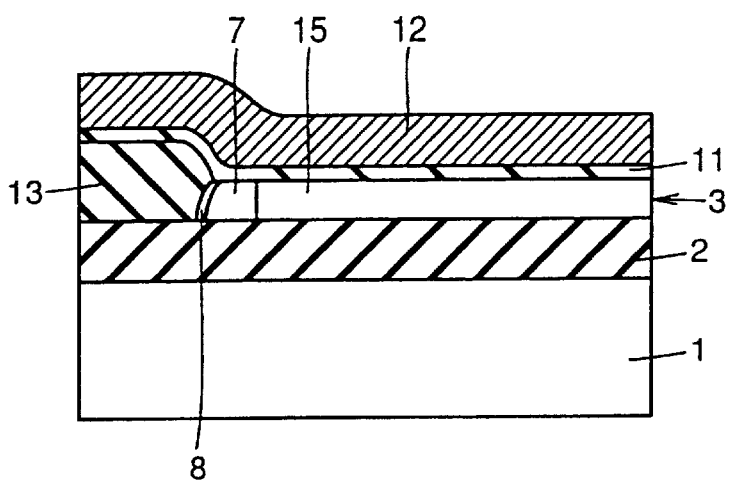
FIG. 21 is a sectional view showing a semiconductor device having an SOI structure according to a second embodiment of the present invention.

With reference to FIG. 21, a semiconductor device according to a second embodiment of the present invention is now described. In this second embodiment, the present invention is applied to an SOI structure employing LOCOS isolation. In this structure, a field oxide film 13 formed by a LOCOS method is formed on an end portion of a silicon layer 3, and the adjacent silicon layer 3 is isolated by this field oxide film 13. Also in such a structure, stress is generated by formation of the field oxide film 13 and a crystal defect readily takes place on the end portion of the silicon layer 3 located under a gate electrode 12. Therefore, an isolation region 7 having a higher concentration of an impurity (boron) than a channel region 15 is formed in order to prevent generation of a parasitic transistor in this portion. Further, it is possible to effectively prevent an impurity from a source/drain region (not shown) from being acceleratively diffused in the isolation region 7, by introducing nitrogen into the isolation region 7 in this embodiment. Namely, high-concentration boron and nitrogen are introduced into the isolation region 7. Further, a nitrogen pileup region 8 where nitrogen is built up is formed on an end portion of the isolation region 7 closer to the field oxide film 13.

Figure 24:
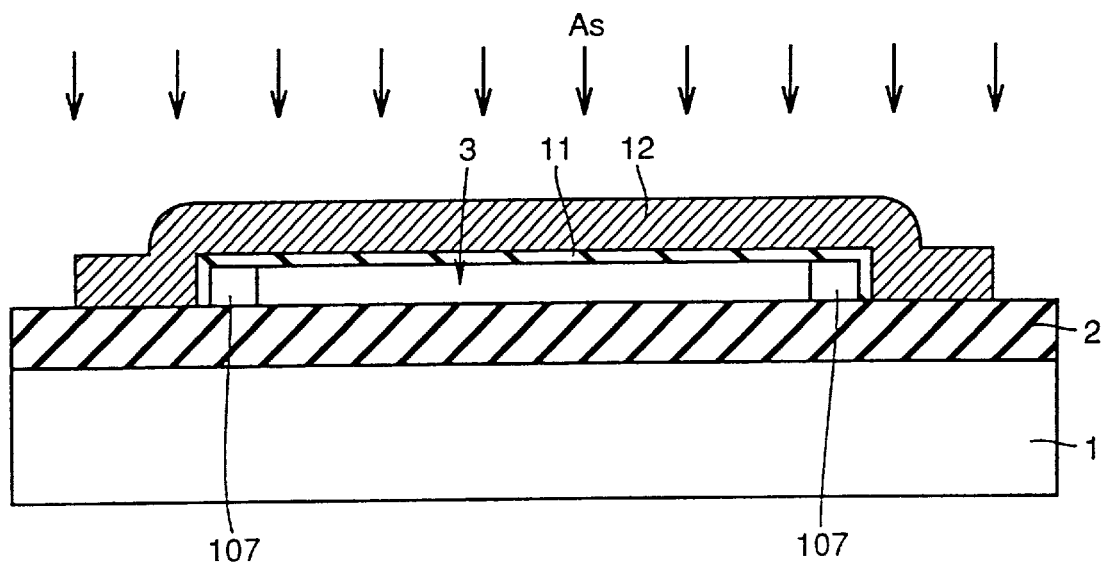
FIG. 24 is a sectional view for illustrating the fabrication process for the semiconductor device having an SOI structure according to the third embodiment of the present invention.
Figure 25:
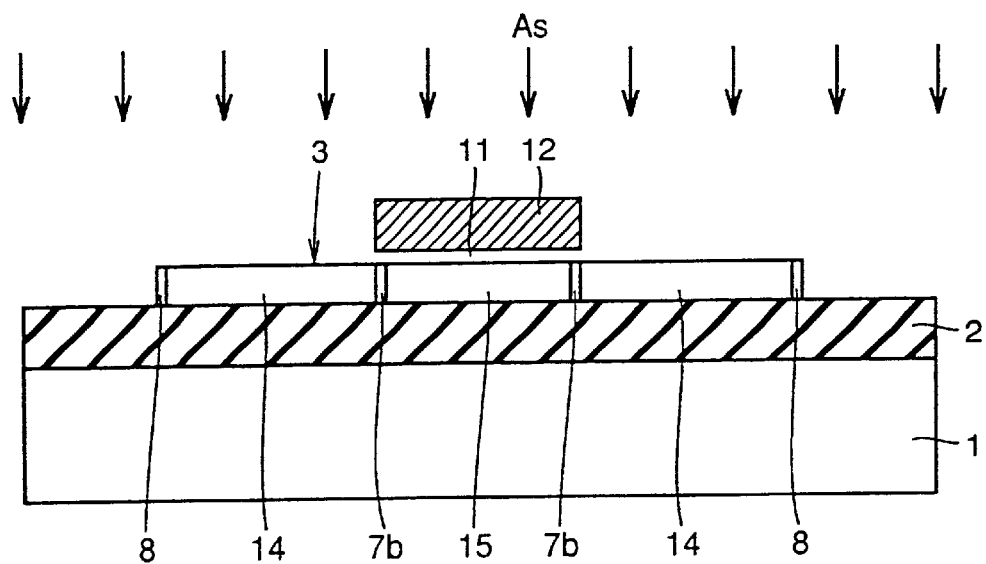
FIG. 25 is a sectional view in a direction orthogonal with respect to FIG. 24.
Figure 26:
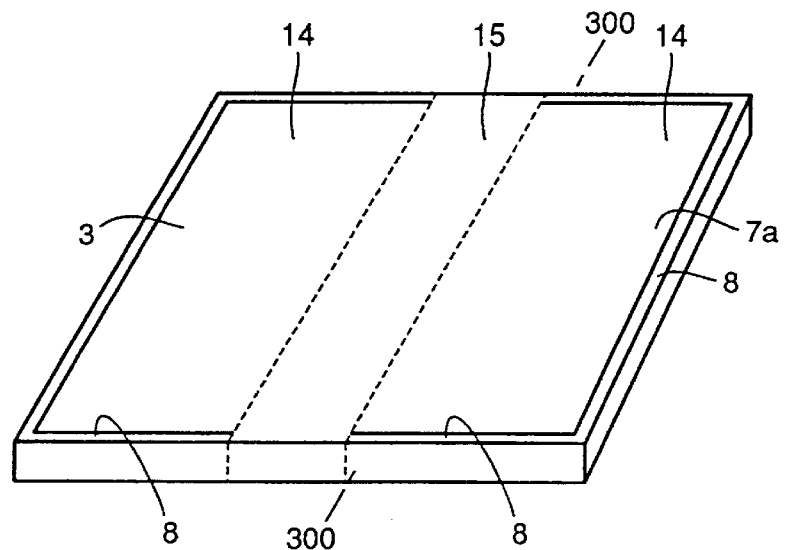
FIG. 26 is a perspective view for illustrating a distributed state of nitrogen in the third embodiment.
Figure 27:
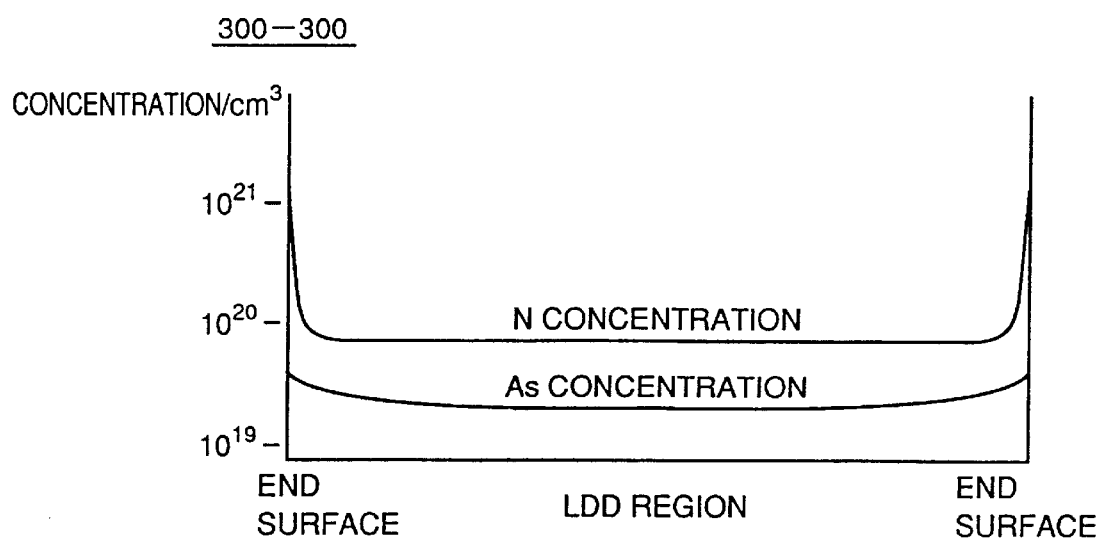
FIG. 27 is an impurity profile diagram along the line 300—300 in FIG. 26.

With reference to FIG. 22 to FIG. 27, a semiconductor device having an SOI structure according to a third embodiment of the present invention and a fabrication process therefor are now described. First, nitrogen is introduced into source/drain regions 14, and nitrogen pileup regions 8 having a high nitrogen concentration are provided on end portions of a silicon layer 3 enclosing the source/drain regions 14 in this third embodiment, as shown in FIG. 26 and FIG. 27. By providing the nitrogen pileup regions 8 having a high nitrogen concentration on the end portions of the source/drain regions 14 in a direction where a gate electrode 12 extends in this way, there is such an effect that nitrogen atoms thereof prevent diffusion of an impurity of the source/drain regions 14 in the end portions, where diffusion readily takes, place, of the source/drain regions 14 in the direction where the gate electrode 12 extends. Therefore, it is possible to prevent the impurity from the source/drain regions 14 from acceleratively diffusing in isolation regions 7. Thus, generation of abnormal leakage currents resulting from the accelerative diffusion can be prevented. In addition to such an effect that accelerative diffusion in the isolation regions 7 can be prevented by nitrogen introduced into the source/drain regions 14, further, a similar effect can be attained also with respect to a channel region 15. In more concrete terms, a silicon layer 3 formed on a buried oxide film 2 may be sufficient in crystallinity, and there is a possibility that a portion inferior in crystallinity exists not only on end portions of the silicon layer 3 but on a portion of the channel region 15. Therefore, it is also conceivable that similar accelerative diffusion partially takes place from the portion of the channel region 15 inferior in crystallinity and an abnormal leakage current is generated as a result. Accelerative diffusion of the impurity from the source/drain regions 14 in such a channel region 15 can also be effectively prevented by introducing nitrogen into the source/drain regions 14. There is a high probability that deterioration of crystallinity in the channel region 15 of the silicon layer 3 takes place in the vicinity of the buried oxide film 2, and hence it is preferable to set a concentration peak of nitrogen introduced into the source/drain regions 14 in a vertical direction (perpendicular direction) at an interface between the buried oxide film 2 and the silicon layer 3.

Figure 22:
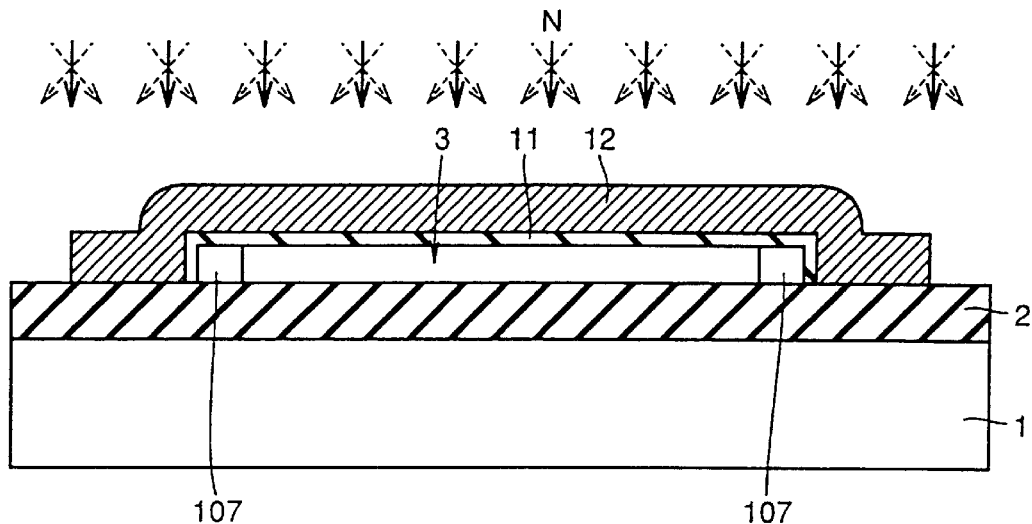
FIG. 22 is a sectional view showing a fabrication process for a semiconductor device having an SOI structure according to a third embodiment of the present invention.
Figure 23:
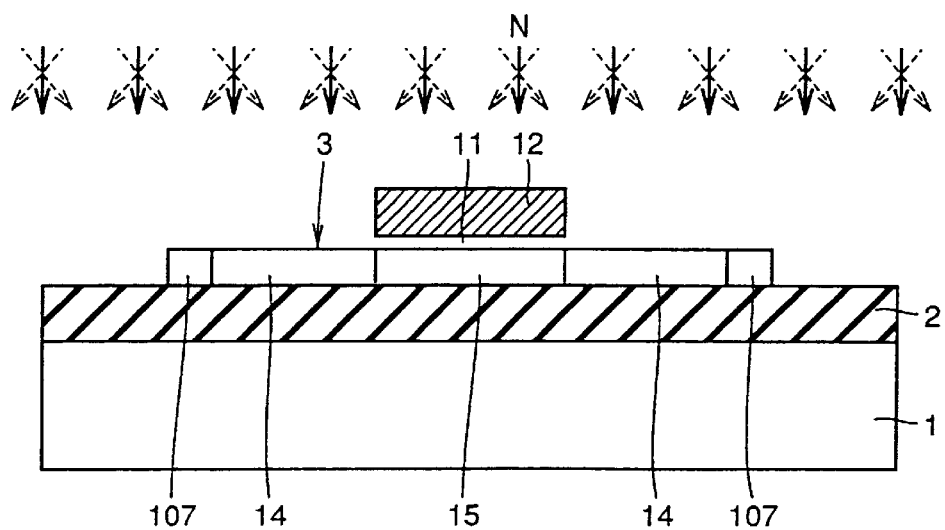
FIG. 23 is a sectional view in a direction orthogonal to FIG. 22.

As the fabrication process for the aforementioned semiconductor device of the third embodiment, the patterned gate electrode 12 is employed as a mask for injecting nitrogen into regions where the source/drain regions 14 are formed under conditions of 10 keV and $1\times10^{15}/cm^2$, as shown in FIG. 22 and FIG. 23. While the figure shows the case of injecting nitrogen in the vertical direction as to this injection of nitrogen, nitrogen may be injected by employing oblique rotational ion implantation. Thereafter the gate electrode 12 is employed as a mask for ion-implanting arsenic (As), as shown in FIG. 24 and FIG. 25. Perpendicular ion implantation is employed for this ion implantation. Thus, the source/drain regions 14 are formed. Diffusion of arsenic can be further effectively prevented by performing injection of nitrogen before injection of arsenic for forming the source/drain regions 14. When injecting nitrogen by employing an oblique rotational ion implantation method while injecting arsenic by employing a perpendicular ion injection method, nitrogen injection regions 6b can be introduced into more inner sides of the gate electrode 12 than arsenic in the source/drain regions 14, as shown in FIG. 25. Thus, it is possible to further effectively prevent arsenic located on the side closer to the channel region 15 from diffusing in the channel region 15. After injection of arsenic, heat treatment of 800° C. and 30 minutes is performed thereby electrically activating arsenic, while the nitrogen pileup regions 8 are formed.

Figure 28:
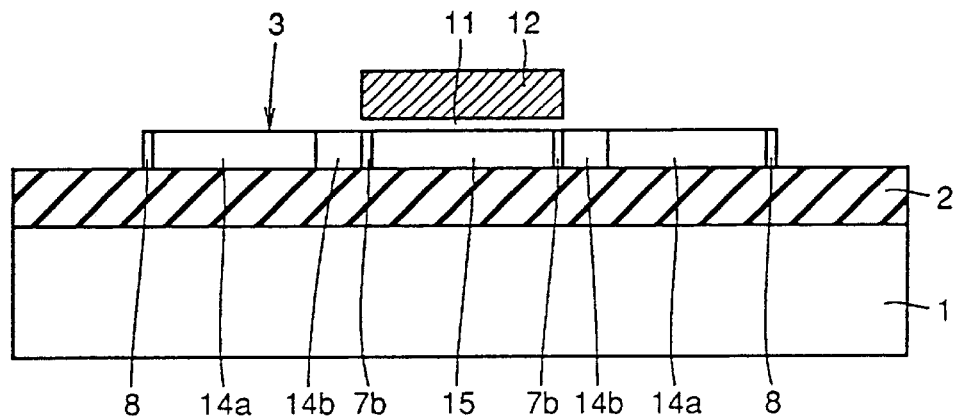
FIG. 28 is a sectional view showing a semiconductor device having an SOI structure according to a fourth embodiment of the present invention.
Figure 29:
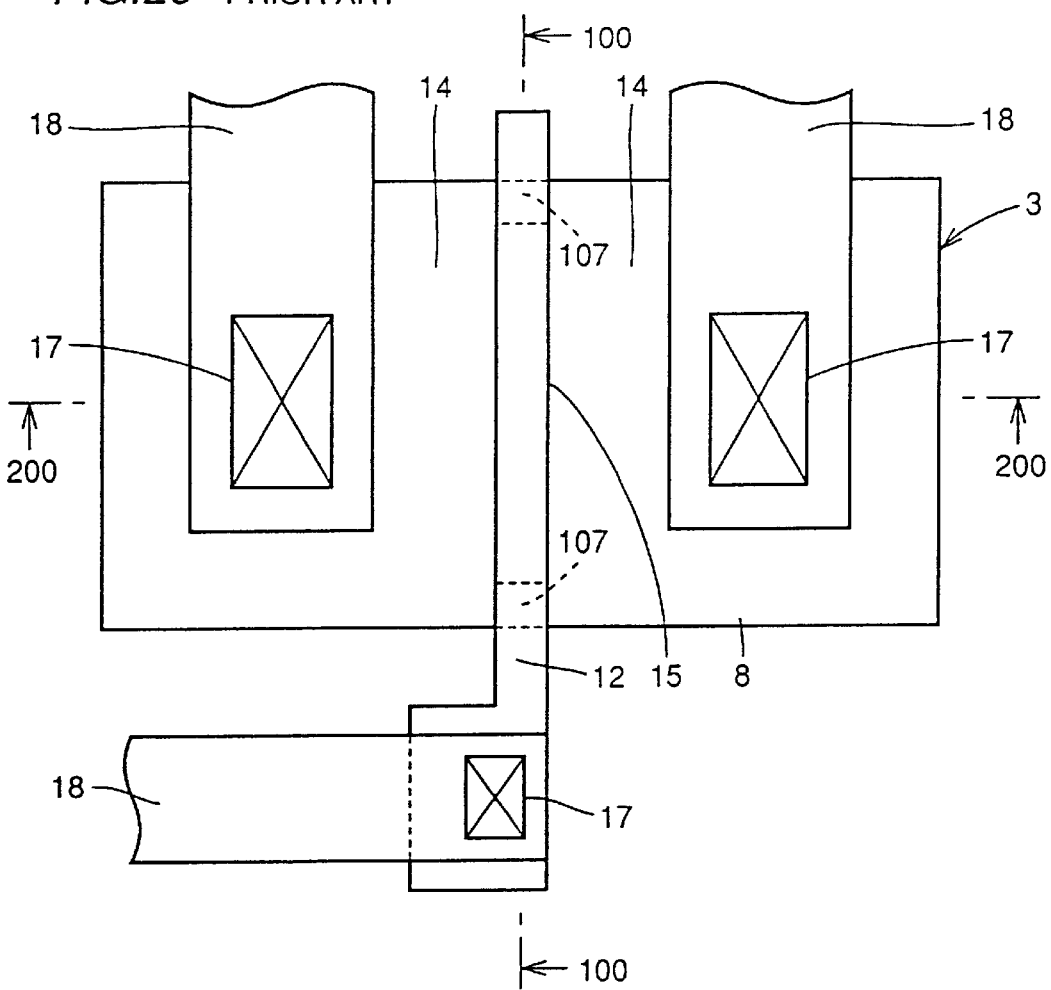
FIG. 29 is a plan view showing a conventional semiconductor device having an SOI structure.
Figure 30:
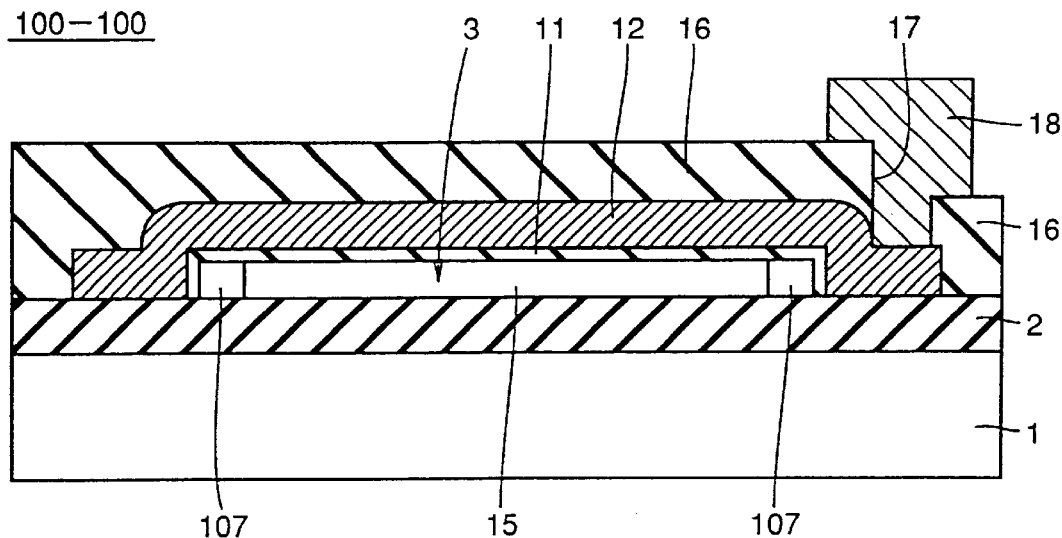
FIG. 30 is a sectional view of the semiconductor device shown in FIG. 29 along the line 100—100.
Figure 31:
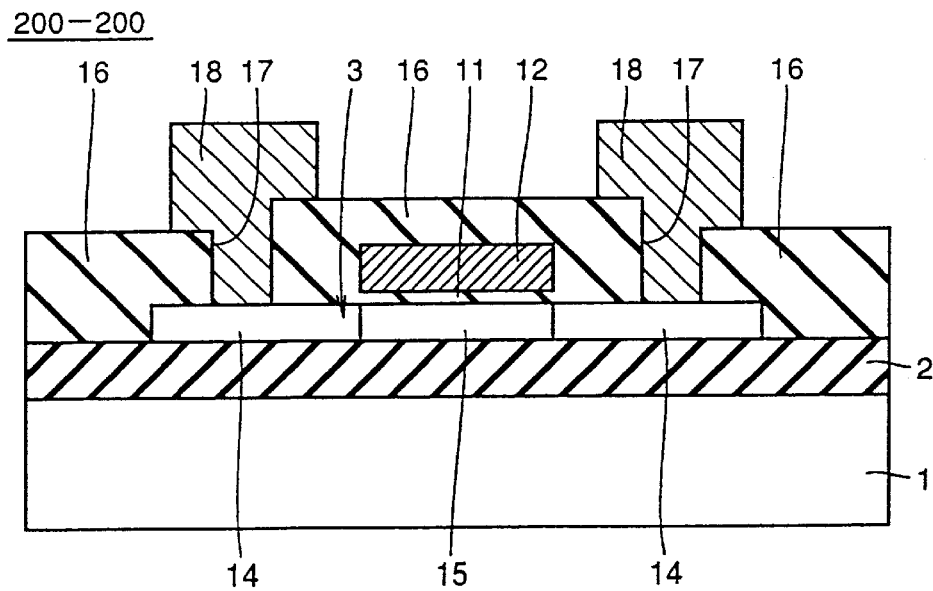
FIG. 31 is a sectional view of the semiconductor device shown in FIG. 29 along the line 200—200.
Figure 32:
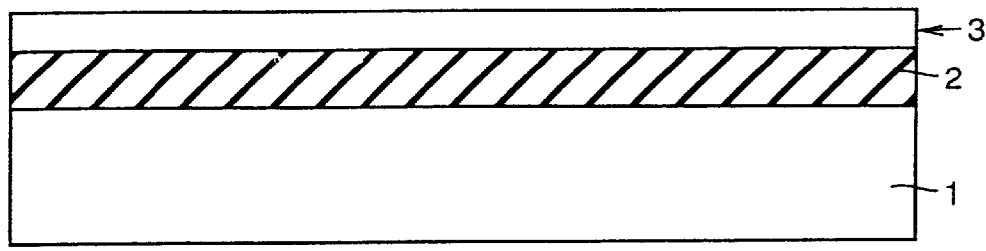
FIG. 32 is a sectional view for illustrating a fabrication process for the conventional semiconductor device shown in FIG. 29 to FIG. 31.
Figure 33:
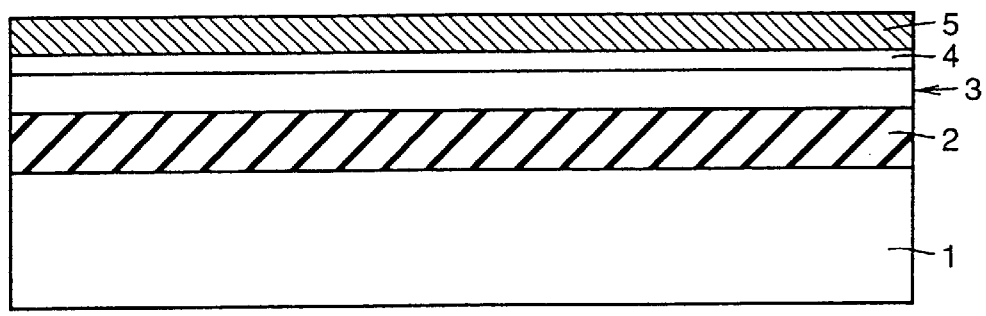
FIG. 33 is a sectional view for illustrating the fabrication process for the conventional semiconductor device shown in FIG. 29 to FIG. 31.
Figure 34:
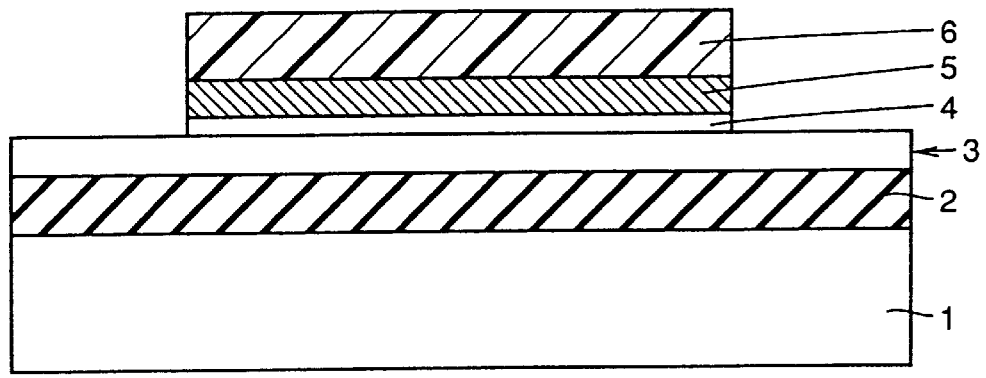
FIG. 34 is a sectional view for illustrating the fabrication process for the conventional semiconductor device shown in FIG. 29 to FIG. 31.
Figure 35:
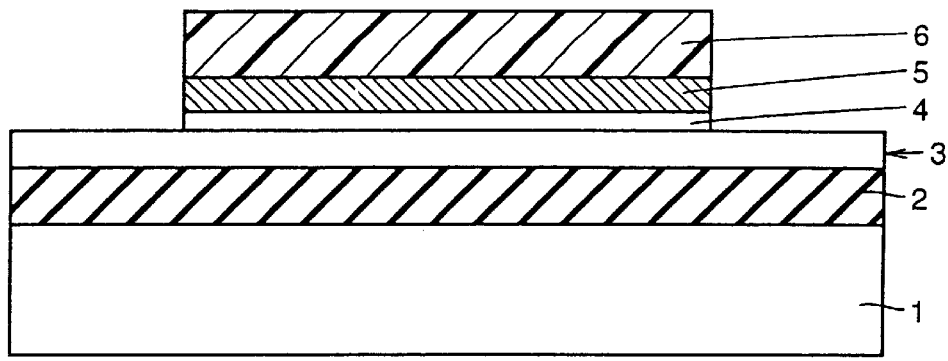
FIG. 35 is a sectional view for illustrating the fabrication process for the conventional semiconductor device shown in FIG. 29 to FIG. 31.
Figure 36:
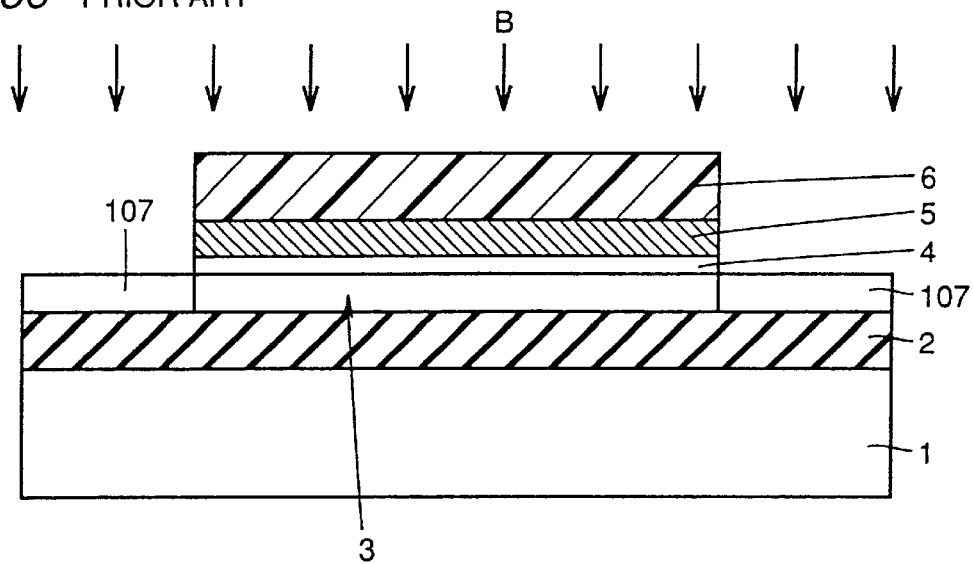
FIG. 36 is a sectional view for illustrating the fabrication process for the conventional semiconductor device shown in FIG. 29 to FIG. 31.
Figure 37:
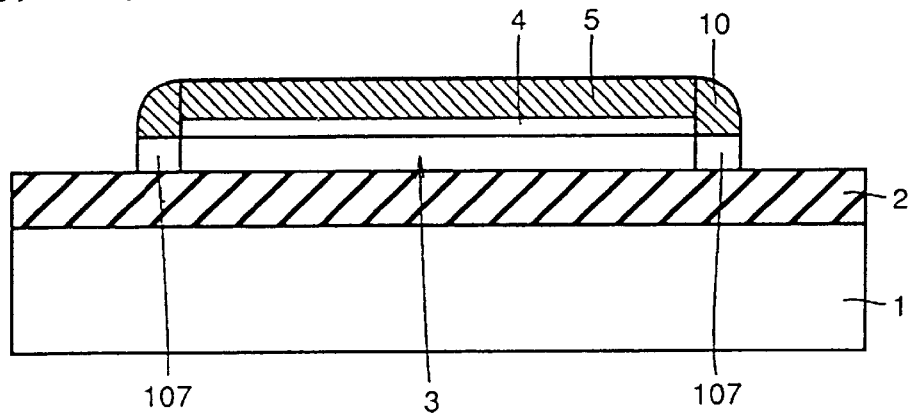
FIG. 37 is a sectional view for illustrating the fabrication process for the conventional semiconductor device shown in FIG. 29 to FIG. 31.
Figure 38:
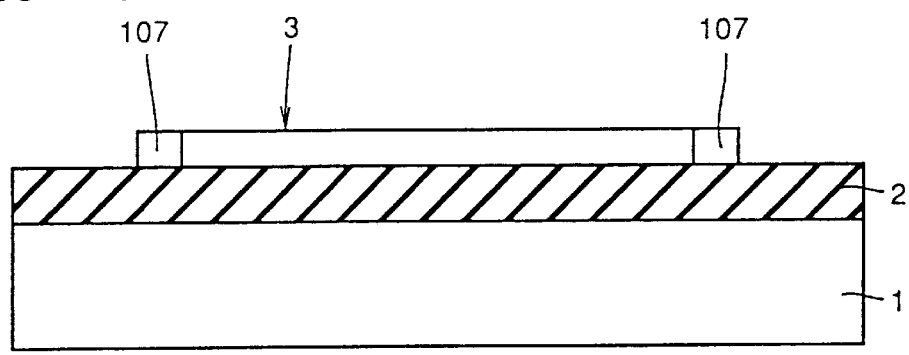
FIG. 38 is a sectional view for illustrating the fabrication process for the conventional semiconductor device shown in FIG. 29 to FIG. 31.
Figure 39:
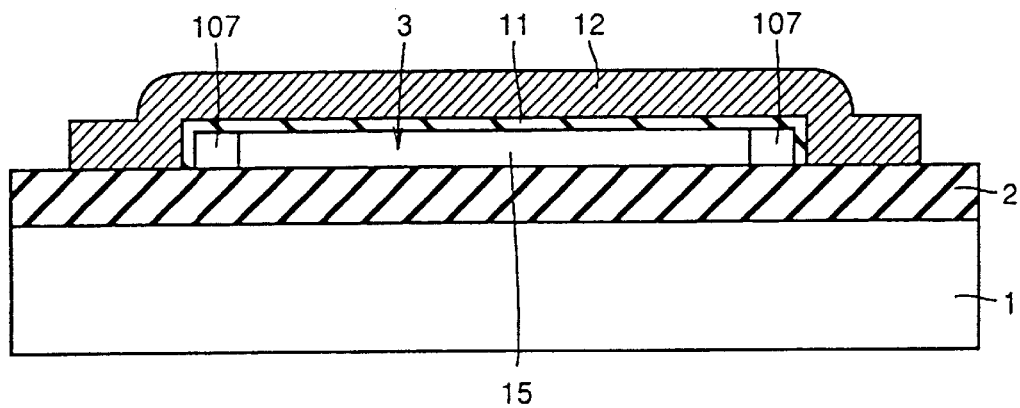
FIG. 39 is a sectional view for illustrating the fabrication process for the conventional semiconductor device shown in FIG. 29 to FIG. 31.
Figure 40:
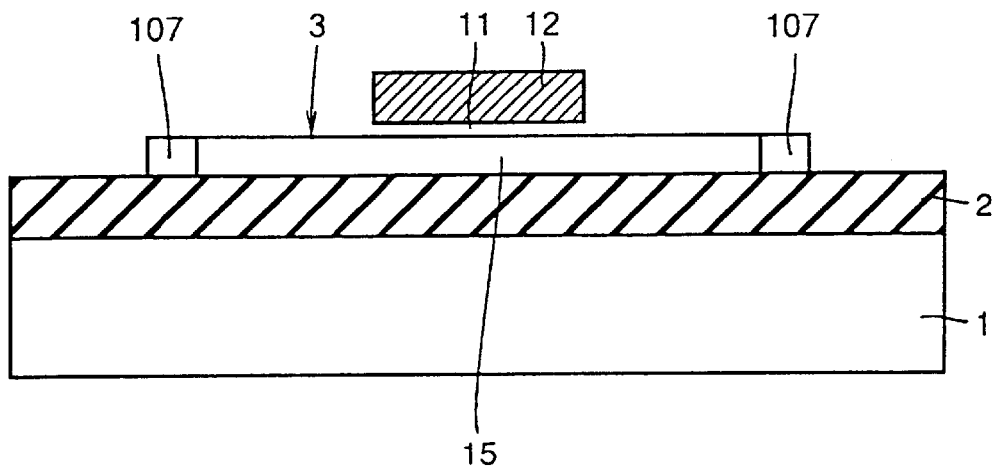
FIG. 40 is a sectional view orthogonal to the section of FIG. 39.
Figure 41:
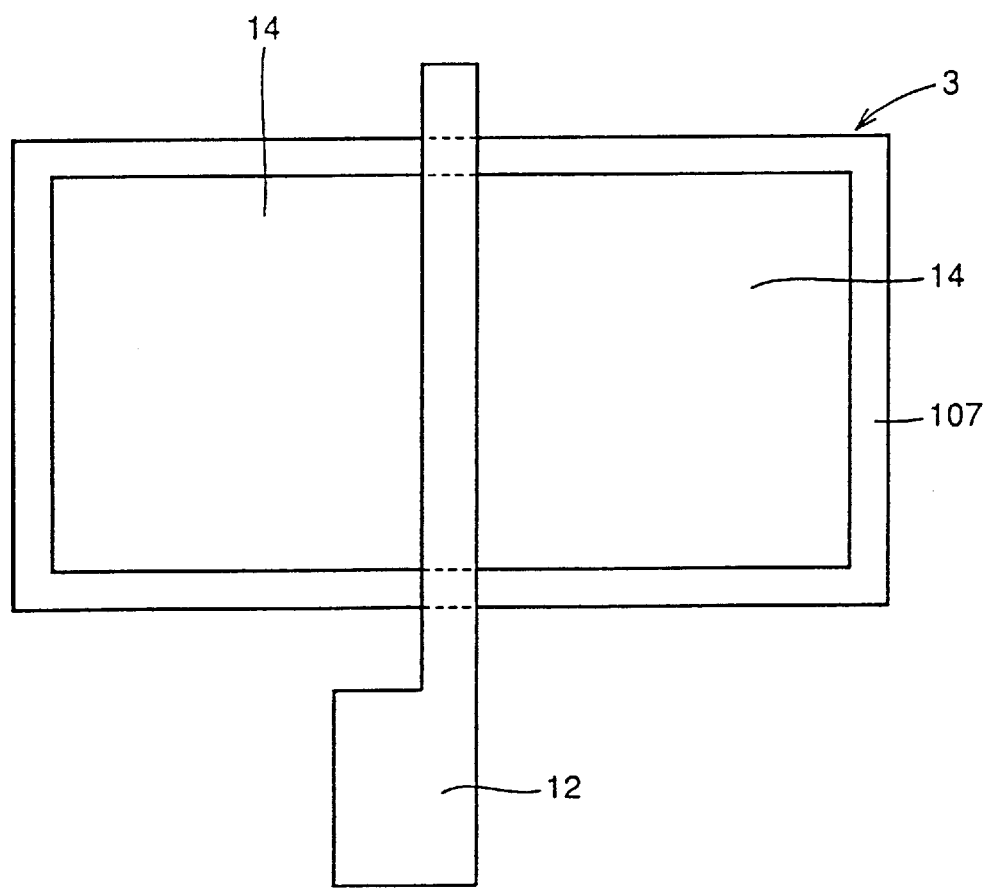
FIG. 41 is a plan view of FIG. 39 and FIG. 40.
Figure 42:
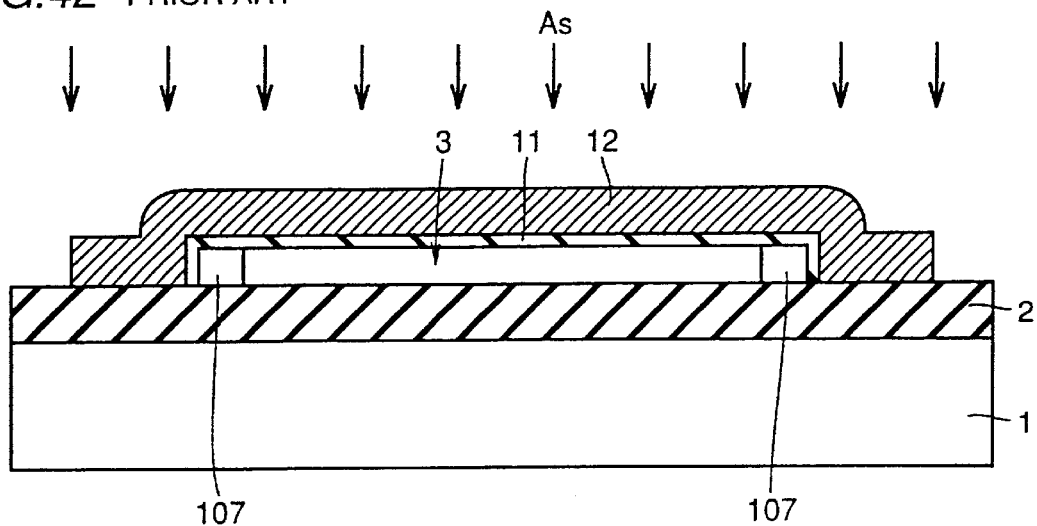
FIG. 42 is a sectional view for illustrating the fabrication process for the conventional semiconductor device shown in FIG. 29 to FIG. 31.
Figure 43:
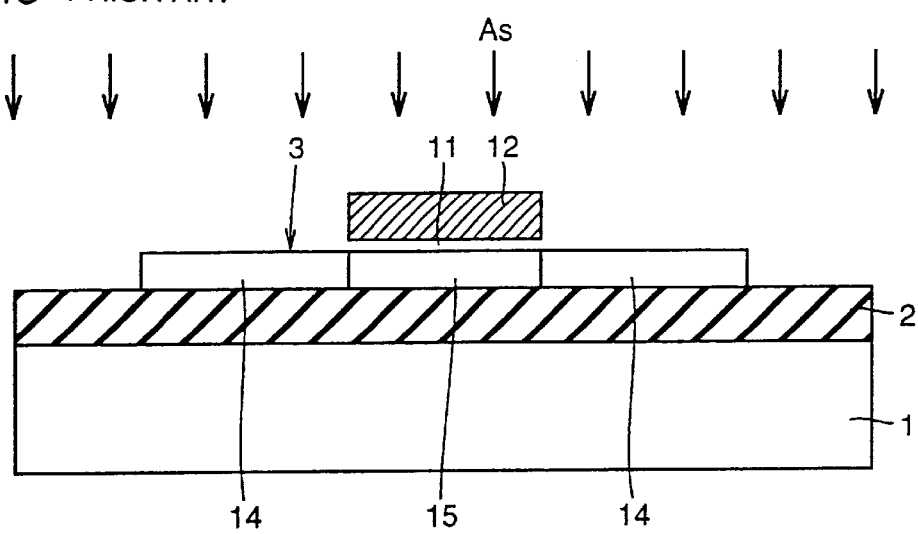
FIG. 43 is a sectional view orthogonal to the section of FIG. 42.
Figure 44:
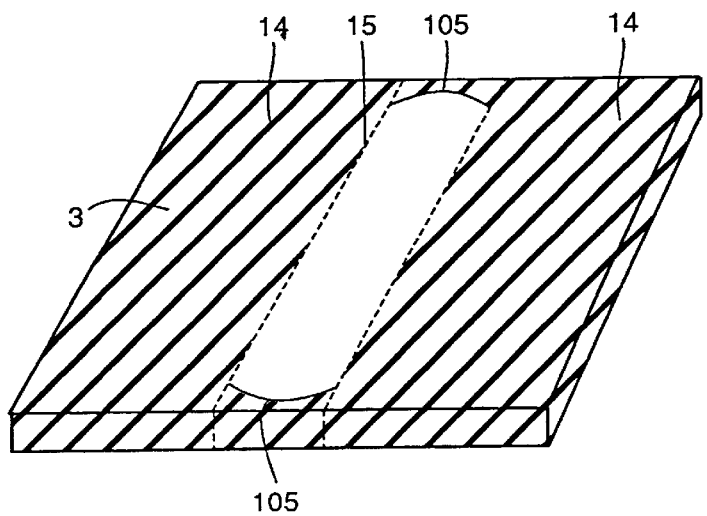
FIG. 44 is a perspective view for illustrating a problem of the conventional semiconductor device.
Figure 45:
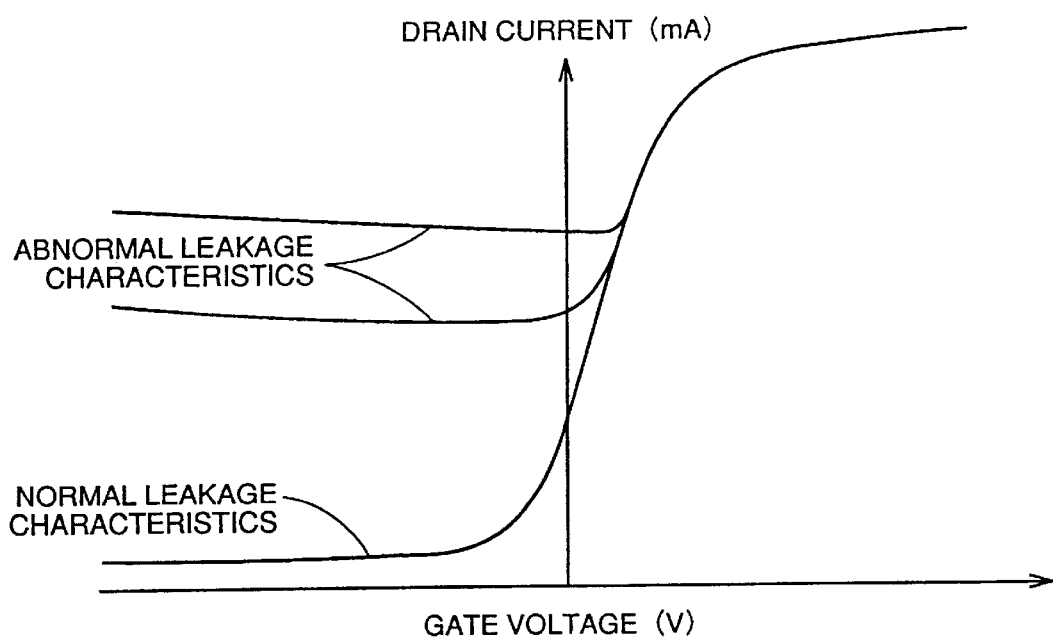
FIG. 45 is a correlation diagram showing the relation between a gate voltage and a drain current for illustrating the problem of the conventional semiconductor device.

Referring to FIG. 28, nitrogen is introduced into source/drain regions having LDD (Lightly Doped Drain) structures in a semiconductor device according to a fourth embodiment of the present invention. The LDD structures are formed by impurity regions 14b of a low concentration and impurity regions 14a of a high concentration. It is possible to effectively prevent diffusion of the impurity from the source/drain regions 14 similarly to the above, also by introducing nitrogen into the source/drain regions (14a, 14b) of the LDD structures in this way. In general, the LDD structures are formed by performing ion implantation for forming the source/drain regions 14b of a low concentration and thereafter performing ion implantation for forming the source/drain regions 14a of a high concentration. In this case, nitrogen is injected before performing ion implantation for the impurity regions 14b of a low concentration. In more detail, nitrogen is preferably injected before performing heat treatment for activating ions injected for formation of the source/drain regions 14a and 14b. Nitrogen injection regions 7b into which nitrogen is injected can be formed on sides closer to a gate electrode 12 than the source/drain regions 14b of a low concentration by injecting nitrogen with an oblique rotational ion implantation method and performing ion implantation for the source/drain regions 14b of a low concentration by employing perpendicular ion implantation. Thus, diffusion of the impurity of the source/drain regions 14b of a low concentration located in the vicinity of a channel region 15 can be further effectively prevented. Further, nitrogen pileup regions 8 can be formed on end portions of a silicon layer 3 by performing heat treatment of about 30 minutes at 800° C. after nitrogen injection.

While nitrogen injection is performed for preventing abnormal diffusion of the impurity of n-type source/drain regions as to NMOS transistors in the aforementioned first to fourth embodiments, similar effects can be attained also when performing nitrogen injection for preventing abnormal diffusion of an impurity of p-type source/drain regions of PMOS transistors. While such structures that only NMOS transistors exist are shown in the aforementioned first to fourth embodiments, the nitrogen injection process can be more simply performed if both of NMOS transistors and PMOS transistors exist, when performing nitrogen injection in common after formation of gate electrodes of both. The structure that nitrogen is introduced into the isolation regions 7 shown in the first embodiment and the structure that nitrogen is introduced into the source/drain regions 14 shown in the third embodiment may be combined with each other. When practicing in this way, diffusion of the impurity from the source/drain regions 14 can be further effectively prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device having an SOI substrate comprising:

a step of forming a semiconductor layer having a major surface on an insulator;

a step of forming a first injection mask on said semiconductor layer;

a step of ion-implanting a first conductivity type impurity into an isolation injection region of said semiconductor layer by employing said first injection mask as a mask thereby forming an impurity region having a higher impurity concentration than a channel region;

a step of forming a gate electrode on the major surface of said semiconductor layer through a gate insulator film;

a step of ion-implanting a second conductivity type impurity into said semiconductor layer by employing said gate electrode as a mask thereby forming a source/drain region;

injecting nitrogen by employing at least either said first mask or said gate electrode as a mask; and a step of performing heat treatment after injection of said nitrogen thereby making the concentration peak of said nitrogen located on an endmost portion of said semiconductor layer, thereby preventing accelerated diffusion of impurities from the source/drain regions into the isolation injection region.

2. The method of fabricating a semiconductor device having an SOI structure in accordance with claim 1, wherein injection of said nitrogen is performed before ion implantation of said second conductivity type impurity for formation of said source/drain region.

3. The method of fabricating a semiconductor device having an SOI structure in accordance with claim 1, wherein ion implantation of said nitrogen is so performed that a concentration peak of said nitrogen in a vertical direction is located in the vicinity of an interface between said semiconductor layer and said insulator by employing said gate electrode as a mask.

4. The method of fabricating a semiconductor device having an SOI structure in accordance with claim 1, wherein said nitrogen is injected into a side closer to said channel region than ion implantation of the second conductivity type impurity for forming said source/drain region by employing said gate electrode as a mask.

* * * * *

UNITED STATES PATENT AND TRADEMARK OFFICE
CERTIFICATE OF CORRECTION

PATENT NO. : 6,509,211 B2
DATED : January 21, 2003
INVENTOR(S) : Yasuo Yamaguchi et al.

It is certified that error appears in the above-identified patent and that said Letters Patent is hereby corrected as shown below:

<u>Title page,</u>
Item [75], Inventors, change the third inventors name from "Iijong Kim Hyogo" to
-- Iljong Kim Hyogo --

Signed and Sealed this

Twenty-eighth Day of October, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,509,211 B2
DATED         : January 21, 2003
INVENTOR(S)   : Yasuo Yamaguchi et al.

It is certified that error appears in the above-identified patent and that said Letters Patent is hereby corrected as shown below:

<u>Title page,</u>
Item [75], Inventors, change the third inventor's name from "Iijong Kim Hyogo" to -- Iljong Kim, Hyogo, Japan --.

This certificate supersedes Certificate of Correction issued October 28, 2003.

Signed and Sealed this

Twenty-seventh Day of January, 2004

JON W. DUDAS
*Acting Director of the United States Patent and Trademark Office*